(12) United States Patent
Kamata et al.

(10) Patent No.: US 8,659,941 B2
(45) Date of Patent: Feb. 25, 2014

(54) SEMICONDUCTOR MEMORY CELL HAVING AN OXIDE SEMICONDUCTOR TRANSISTOR AND ERASABLE BY ULTRAVIOLET LIGHT

(75) Inventors: Koichiro Kamata, Kanagawa (JP); Yusuke Sekine, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 182 days.

(21) Appl. No.: 12/951,899

(22) Filed: Nov. 22, 2010

(65) Prior Publication Data

US 2011/0122673 A1    May 26, 2011

(30) Foreign Application Priority Data

Nov. 24, 2009 (JP) ................. 2009-266407

(51) Int. Cl.
*G11C 11/40* (2006.01)
(52) U.S. Cl.
USPC ............ 365/182; 365/174; 365/104; 365/103
(58) Field of Classification Search
USPC .................................. 365/182, 174, 104, 103
See application file for complete search history.

(56) References Cited

U.S. PATENT DOCUMENTS

| | | | |
|---|---|---|---|
| 4,466,081 A | 8/1984 | Masuoka | |
| 5,349,366 A | 9/1994 | Yamazaki et al. | |
| 5,731,856 A | 3/1998 | Kim et al. | |
| 5,744,864 A | 4/1998 | Cillessen et al. | |
| 5,953,246 A | 9/1999 | Takashima et al. | |
| 6,127,702 A | 10/2000 | Yamazaki et al. | |
| 6,294,274 B1 | 9/2001 | Kawazoe et al. | |
| 6,563,174 B2 | 5/2003 | Kawasaki et al. | |
| 6,727,522 B1 | 4/2004 | Kawasaki et al. | |
| 7,049,190 B2 | 5/2006 | Takeda et al. | |

(Continued)

FOREIGN PATENT DOCUMENTS

| | | |
|---|---|---|
| EP | 0 725 402 A2 | 8/1996 |
| EP | 1 737 044 A1 | 12/2006 |

(Continued)

OTHER PUBLICATIONS

Asakuma, N et al., "Crystallization and Reduction of Sol-Gel-Derived Zinc Oxide Films by Irradiation With Ultraviolet Lamp," Journal of Sol-Gel Science and Technology, 2003, vol. 26, pp. 181-184.

(Continued)

*Primary Examiner* — Andrew Q Tran
(74) *Attorney, Agent, or Firm* — Fish & Richardson P.C.

(57) ABSTRACT

A nonvolatile memory includes a memory cell including a first transistor and a second transistor. The first transistor includes a first channel, a first gate electrode, a first source electrode, and a first drain electrode. The second transistor includes a second channel made of oxide semiconductor material, a second gate electrode, a second source electrode, and a second drain electrode. One of the second source electrode and the second drain electrode is electrically connected to the first gate electrode. Data writing in the memory cell is done by raising the potential of a node between one of the second source electrode and the second drain electrode and the first gate electrode. Data erasure in the memory cell is done by irradiating the second channel with ultraviolet light and lowering the potential of the node.

13 Claims, 31 Drawing Sheets

(56) References Cited

U.S. PATENT DOCUMENTS

| | | | |
|---|---|---|---|
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,211,825 B2 | 5/2007 | Shih et al. | |
| 7,242,610 B2 * | 7/2007 | Kumagai | 365/185.01 |
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,674,650 B2 | 3/2010 | Akimoto et al. | |
| 7,732,819 B2 | 6/2010 | Akimoto et al. | |
| 7,791,074 B2 | 9/2010 | Iwasaki | |
| 8,194,469 B2 * | 6/2012 | Tanaka et al. | 365/185.3 |
| 8,363,452 B2 | 1/2013 | Yamazaki et al. | |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2003/0189401 A1 | 10/2003 | Kido et al. | |
| 2003/0218222 A1 | 11/2003 | Wager et al. | |
| 2004/0038446 A1 | 2/2004 | Takeda et al. | |
| 2004/0127038 A1 | 7/2004 | Carcia et al. | |
| 2005/0017302 A1 | 1/2005 | Hoffman | |
| 2005/0199959 A1 | 9/2005 | Chiang et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Covan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0002590 A1 | 1/2009 | Kimura |
| 2009/0045397 A1 | 2/2009 | Iwasaki |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0097838 A1 | 4/2010 | Tanaka et al. |
| 2010/0109002 A1 | 5/2010 | Itagaki et al. |
| 2010/0148171 A1 | 6/2010 | Hayashi et al. |
| 2010/0193785 A1 | 8/2010 | Kimura |
| 2010/0203673 A1 | 8/2010 | Hayashi et al. |
| 2010/0276689 A1 | 11/2010 | Iwasaki |
| 2010/0279462 A1 | 11/2010 | Iwasaki |
| 2011/0101332 A1 | 5/2011 | Yamazaki et al. |
| 2011/0101334 A1 | 5/2011 | Yamazaki et al. |
| 2011/0101339 A1 | 5/2011 | Yamazaki et al. |
| 2011/0101351 A1 | 5/2011 | Yamazaki |

FOREIGN PATENT DOCUMENTS

| | | |
|---|---|---|
| EP | 2 226 847 A2 | 9/2010 |
| JP | 57-105889 A | 7/1982 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-119298 A | 5/1993 |
| JP | 05-251705 A | 9/1993 |
| JP | 08-241585 A | 9/1996 |
| JP | 08-264794 A | 10/1996 |
| JP | 11-505377 A | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2002-368226 A | 12/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2006-165532 A | 6/2006 |
| JP | 2007-042172 A | 2/2007 |
| JP | 2007-103918 A | 4/2007 |
| JP | 2007-250044 A | 9/2007 |
| JP | 2009-033145 A | 2/2009 |
| JP | 2009-099953 A | 5/2009 |
| JP | 2009-146100 A | 7/2009 |
| JP | 2009-182194 A | 8/2009 |
| JP | 2009-212443 A | 9/2009 |
| WO | 2004/114391 A1 | 12/2004 |
| WO | 2007/029844 A1 | 3/2007 |
| WO | 2009/041713 A2 | 4/2009 |
| WO | 2009/110623 A1 | 9/2009 |

OTHER PUBLICATIONS

Asaoka, Y et al., "29.1: Polarizer-Free Reflective LCD Combined With Ultra Low-Power Driving Technology," SID Digest '09 : SID International Symposium Digest of Technical Papers, 2009, pp. 395-398.

(56) References Cited

OTHER PUBLICATIONS

Chern, H et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.

Cho, D et al., "21.2: Al and Sn-Doped Zinc Indium Oxide Thin Film Transistors for AMOLED Back-Plane," SID Digest '09 : SID International Symposium Digest of Technical Papers, May 31, 2009, pp. 280-283.

Clark, S et al., "First Principles Methods Using CASTEP," Zeitschrift fur Kristallographie, 2005, vol. 220, pp. 567-570.

Coates. D et al., "Optical Studies of the Amorphous Liquid-Cholesteric Liquid Crystal Transition: The Blue Phase," Physics Letters, Sep. 10, 1973, vol. 45A, No. 2, pp. 115-116.

Costello, M et al., "Electron Microscopy of a Cholesteric Liquid Crystal and Its Blue Phase," Phys. Rev. A (Physical Review. A), May 1, 1984, vol. 29, No. 5, pp. 2957-2959.

Dembo, H et al., "RFCPUS on Glass and Plastic Substrates Fabricated by TFT Transfer Technology," IEDM 05: Technical Digest of International Electron Devices Meeting, Dec. 5, 2005, pp. 1067-1069.

Fortunato, E et al., "Wide-Bandgap High-Mobility ZNO Thin-Film Transistors Produced at Room Temperature," Appl. Phys. Lett. (Applied Physics Letters), Sep. 27, 2004, vol. 85, No. 13, pp. 2541-2543.

Fung, T et al., "2-D Numerical Simulation of High Performance Amorphous In—Ga—Zn—O TFTs for Flat Panel Displays," AM-FPD '08 Digest of Technical Papers, Jul. 2, 2008, pp. 251-252, The Japan Society of Applied Physics.

Godo, H et al., "P-9: Numerical Analysis on Temperature Dependence of Characteristics of Amorphous In—Ga—Zn—Oxide TFT," SID Digest '09 : SID International Symposium Digest of Technical Papers, May 31, 2009, pp. 1110-1112.

Godo, H et al., "Temperature Dependence of Characteristics and Electronic Structure for Amorphous In—Ga—Zn—Oxide TFT," AM-FPD '09 Digest of Technical Papers, Jul. 1, 2009, pp. 41-44.

Hayashi, R et al., "42.1: Invited Paper: Improved Amorphous In—Ga—Zn—O TFTS," SID Digest '08 : SID International Symposium Digest of Technical Papers, May 20, 2008, vol. 39, pp. 621-624.

Hirao, T et al., "Novel Top-Gate Zinc Oxide Thin-Film Transistors (ZNO TFTS) for AMLCDs," Journal of the SID , 2007, vol. 15, No. 1, pp, 17-22.

Hosono, H et al., "Working hypothesis to explore novel wide band gap electrically conducting amorphous oxides and examples," J. Non-Cryst. Solids (Journal of Non-Crystalline Solids), 1996, vol. 198-200, pp. 165-169.

Hosono, H, "68.3: Invited Paper:Transparent Amorphous Oxide Semiconductors for High Performance TFT," SID Digest '07 : SID International Symposium Digest of Technical Papers, 2007, vol. 38, pp. 1830-1833.

Hsieh, H et al., "P-29: Modeling of Amorphous Oxide Semiconductor Thin Film Transistors and Subgap Density of States," SID Digest '08 : SID International Symposium Digest of Technical Papers, 2008, vol. 39, pp. 1277-1280.

Ikeda., T et al., "Full-Functional System Liquid Crystal Display Using CG-Silicon Technology," SID Digest '04 : SID International Symposium Digest of Technical Papers, 2004, vol. 35, pp. 860-863.

Janotti, A et al., "Native Point Defects in ZnO," Phys. Rev. B (Physical Review. B), 2007, vol. 76, pp. 165202-1-165202-22.

Janotti, A et al., "Oxygen Vacancles in ZnO," Appl. Phys. Lett. (Applied Physics Letters), 2005, vol. 87, pp. 122102-1-122102-3.

Jeong, J et al., "3.1: Distinguished Paper: 12.1-Inch WXGA AMOLED Display Driven by Indium—Gallium—Zinc Oxide TFTs Array," SID Digest '08 : SID International Symposium Digest of Technical Papers, May 20, 2008, vol. 39, No. 1, pp. 1-4.

Jin, D et al., "65.2: Distinguished Paper:World-Largest (6.5") Flexible Full Color Top Emission AMOLED Display on Plastic Film and Its Bending Properties," SID Digest '09 : SID International Symposium Digest of Technical Papers, May 31, 2009, pp. 983-985.

Kanno, H et al., "White Stacked Electrophosphorecent Organic Light-Emitting Devices Employing MOO3 as a Charge-Generation Layer," Adv. Mater. (Advanced Materials), 2006, vol. 18, No. 3, pp. 339-342.

Kikuchi, H et al., "39.1: Invited Paper: Optically Isotropic Nano-Structured Liquid Crystal Composites for Display Applications," SID Digest '09 : SID International Symposium Digest of Technical Papers, May 31, 2009, pp. 578-581.

Kikuchi, H et al., "62.2: Invited Paper: Fast Electro-Optical Switching in Polymer-Stabilized Liquid Crystalline Blue Phases for Display Application," SID Digest '07 : SID International Symposium Digest of Technical Papers, 2007, vol. 38, pp. 1737-1740.

Kikuchi, H et al., "Polymer-Stabilized Liquid Crystal Blue Phases,", Nature Materials, Sep. 1, 2002, vol. 1, pp. 64-68.

Kim, S et al., "High-Performance oxide thin film transistors passivated by various gas plasmas," The Electrochemical Society, 214th ECS Meeting, 2008, No. 2317, 1 page.

Kimizuka, N et al., "Spinel,YBFE2O4, and YB2FE3O7 Types of Structures for Compounds in the IN2O3 and SC2O3—A2O3—BO Systems [A; Fe, Ga, or Al; B: Mg, Mn, Fe, Ni, Cu,or Zn] at Temperatures Over 1000° C.," Journal of Solid State Chemistry, 1985, vol. 60, pp. 382-384.

Kimizuka, N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System," Journal of Solid State Chemistry, Apr. 1, 1995, vol. 116, No. 1, pp. 170-178.

Kitzerow, H et al., "Observation of Blue Phases in Chiral Networks," Liquid Crystals, 1993, vol. 14, No. 3, pp. 911-916.

Kurokawa, Y et al., "UHF RFCPUS on Flexible and Glass Substrates for Secure RFID Systems," Journal of Solid-State Circuits , 2008, vol. 43, No. 1, pp. 292-299.

Lany, S et al., "Dopability, Intrinsic Conductivity, and Nonstoichiometry of Transparent Conducting Oxides," Phys. Rev. Lett. (Physical Review Letters), Jan. 26, 2007, vol. 98, pp. 045501-1-045501-4.

Lee, H et al., "Current Status of, Challenges to, and Perspective View of AM-OLED," IDW '06 : Proceedings of the 13th International Display Workshops, Dec. 7, 2006, pp. 663-666.

Lee, J et al., "World's Largest (15-Inch) XGA AMLCD Panel Using IGZO Oxide TFT," SID Digest '08 : SID International Symposium Digest of Technical Papers, May 20, 2008, vol. 39, pp. 625-628.

Lee, M et al., "15.4: Excellent Performance of Indium—Oxide-Based Thin-Film Transistors by DC Sputtering," SID Digest '09 : SID International Symposium Digest of Technical Papers, May 31, 2009, pp. 191-193.

Li, C et al., C et al. "Modulated Structures of Homologous Compounds InMO3(ZnO)m (M=In,Ga; m=Integer) Described by Four-Dimensional Superspace Group," Journal of Solid State Chemistry, 1998, vol. 139, pp. 347-355.

Masuda, S et al., "Transparent thin film transistors using ZnO as an active channel layer and their electrical properties," J. Appl. Phys. (Journal of Applied Physics), Feb. 1, 2003, vol. 93, No. 3, pp. 1624-1630.

Meiboom, S et al., "Theory of the Blue Phase of Cholesteric Liquid Crystals," Phys. Rev. Lett. (Physical Review Letters), May 4, 1981, vol. 46, No. 18, pp. 1216-1219.

Miyasaka, M, "SUFTLA Flexible Microelectronics on Their Way to Business," SID Digest '07 : SID International Symposium Digest of Technical Papers, 2007, vol. 38, pp. 1673-1676.

Mo, Y et al., "Amorphous Oxide TFT Backplanes for Large Size AMOLED Displays," IDW '08 : Proceedings of the 6th International Display Workshops, Dec. 3, 2008, pp. 581-584.

Nakamura, "Synthesis of Homologous Compound with New Long-Period Structure," NIRIM Newsletter, Mar. 1995, vol. 150, pp. 1-4 with English translation.

Nakamura, M et al., "The phase relations in the In2O3—Ga2ZnO4—ZnO system at 1350° C.," Journal of Solid State Chemistry, Aug. 1, 1991, vol. 93, No. 2, pp. 298-315.

Nomura, K et al., "Thin-Film Transistor Fabricated in Single-Crystalline Transparent Oxide Semiconductor," Science, May 23, 2003, vol. 300, No. 5623, pp. 1269-1272.

(56) References Cited

OTHER PUBLICATIONS

Nomura, K et al., "Amorphous Oxide Semiconductors for High-Performance Flexible Thin-Film Transistors," Jpn. J. Appl. Phys. (Japanese Journal of Applied Physics), 2006, vol. 45, No. 5B, pp. 4303-4308.

Nomura, K et al., "Room-Temperature Fabrication of Transparent Flexible Thin-Film Transistors Using Amorphous Oxide Semiconductors," Nature, Nov. 25, 2004, vol. 432, pp. 488-492.

Nomura, K et al., "Carrier transport in transparent oxide semiconductor with intrinsic structural randomness probed using single-crystalline InGaO3(ZnO)5 films," Appl. Phys. Lett. (Applied Physics Letters), Sep. 13, 2004, vol. 85, No. 11, pp. 1993-1995.

Nowatari, H et al., "60.2: Intermediate Connector With Suppressed Voltage Loss for White Tandem OLEDS," SID Digest '09 : SID International Symposium Digest of Technical Papers, May 31, 2009, vol. 40, pp. 899-902.

Oba, F et al., "Defect energetics in ZnO: A hybrid Hartree-Fock density functional study," Phys. Rev. B (Physical Review. B), 2008, vol. 77, pp. 245202-1-245202-6.

Oh, M et al., "Improving the Gate Stability of ZNO Thin-Film Transistors With Aluminum Oxide Dielectric Layers," J. Electrochem. Soc. (Journal of the Electrochemical Society), 2008, vol. 155, No. 12, pp. H1009-H1014.

Ohara, H et al., "21.3: 4.0 In. QVGA AMOLED Display Using In—Ga—Zn—Oxide TFTS With a Novel Passivation Layer," SID Digest '09 : SID International Symposium Digest of Technical Papers, May 31, 2009, pp. 284-287.

Ohara, H et al., "Amorphous In—Ga—Zn—Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.

Orita, M et al., "Amorphous transparent conductive oxide InGaO3(ZnO)m (m<4):a Zn4s conductor," Philosophical Magazine, 2001, vol. 81, No. 5, pp. 501-515.

Orita, M et al., "Mechanism of Electrical Conductivity of Transparent InGaZnO4," Phys. Rev. B (Physical Review. B), Jan. 15, 2000, vol. 61, No. 3, pp. 1811-1816.

Osada, T et al., "15.2: Development of Driver-Integrated Panel using Amorphous In—Ga—Zn—Oxide TFT," SID Digest '09 : SID International Symposium Digest of Technical Papers, May 31, 2009, pp. 184-187.

Osada, T et al., "Development of Driver-Integrated Panel Using Amorphous In—Ga—Zn—Oxide TFT," AM-FPD '09 Digest of Technical Papers, Jul. 1, 2009, pp. 33-36.

Park, J et al., "Dry etching of ZnO films and plasma-induced damage to optical properties," J. Vac. Sci. Technol. B (Journal of Vacuum Science & Technology B), Mar. 1, 2003, vol. 21, No. 2, pp. 800-803.

Park, J et al., "Improvements in the Device Characteristics of Amorphous Indium Gallium Zinc Oxide Thin-Film Transistors by Ar Plasma Treatment," Appl. Phys. Lett. (Applied Physics Letters), Jun. 26, 2007, vol. 90, No. 26, pp. 262106-1-262106-3.

Park, J et al., "Electronic Transport Properties of Amorphous Indium—Gallium—Zinc Oxide Semiconductor Upon Exposure to Water," Appl. Phys. Lett. (Applied Physics Letters), 2008, vol. 92, pp. 072104-1-072104-3.

Park, J et al., "High performance amorphous oxide thin film transistors with self-aligned top-gate structure," IEDM 09: Technical Digest of International Electron Devices Meeting, Dec. 7, 2009, pp. 191-194.

Park, Sang-Hee et al., "42.3: Transparent ZnO Thin Film Transistor for the Application of High Aperture Ratio Bottom Emission AM-OLED Display," SID Digest '08 : SID International Symposium Digest of Technical Papers, May 20, 2008, vol. 39, pp. 629-632.

Park, J et al., "Amorphous Indium—Gallium—Zinc Oxide TFTS and Their Application for Large Size AMOLED," AM-FPD '08 Digest of Technical Papers, Jul. 2, 2008, pp. 275-278.

Park, S et al., "Challenge to Future Displays: Transparent AM-OLED Driven by PEALD Grown ZNO TFT," IMID '07 Digest, 2007, pp. 1249-1252.

Prins, M et al., "A Ferroelectric Transparent Thin-Film Transistor," Appl. Phys. Lett. (Applied Physics Letters), Jun. 17, 1996, vol. 68, No. 25, pp. 3650-3652.

Sakata, J et al., "Development of 4.0-In. AMOLED Display With Driver Circuit Using Amorphous In—Ga—Zn—Oxide TFTS," IDW '09 : Proceedings of the 16th International Display Workshops, 2009, pp. 689-692.

Son, K et al., "42.4L: Late-News Paper: 4 Inch QVGA AMOLED Driven by the Threshold Voltage Controlled Amorphous GIZO (Ga2O3—In2O3—ZnO) TFT," SID Digest '08 : SID International Symposium Digest of Technical Papers, May 20, 2008, vol. 39, pp. 633-636.

Takahashi, M et al., "Theoretical Analysis of IGZO Transparent Amorphous Oxide Semiconductor," IDW '08 : Proceedings of the 15th International Display Workshops, Dec. 3, 2008, pp. 1637-1640.

Tsuda, K et al., "Ultra Low Power Consumption Technologies for Mobile TFT-LCDs," IDW '02 : Proceedings of the 9th International Display Workshops, Dec. 4, 2002, pp. 295-298.

Ueno, K et al., "Field-Effect Transistor on SrTiO3 with Sputtered Al2O3 Gate Insulator," Appl. Phys. Lett. (Applied Physics Letters), Sep. 1, 2003, vol. 83, No. 9, pp. 1755-1757.

Van de Walle C, "Hydrogen as a Cause of Doping in Zinc Oxide," Phys. Rev. Lett. (Physical Review Letters), Jul. 31, 2000, vol. 85, No. 5, pp. 1012-1015.

Ishii, T et al., "A Poly-Silicon TFT With a Sub-5-nm Thick Channel for Low-Power Gain Cell Memory in Mobile Applications," IEEE Transactions on Electron Devices, Nov. 1, 2004, vol. 51, No. 11, pp. 1805-1810.

Kim, W et al., "An Experimental High-Density DRAM Cell with a Built-in Gain Stage," IEEE Journal of Solid-State Circuits, Aug. 1, 1994, vol. 29, No. 8, pp. 978-981.

Shukuri, S et al., "A Complementary Gain Cell Technology for Sub-1 V Supply DRAMs," IEDM 92: Technical Digest of International Electron Devices Meeting, Dec. 13, 1992, pp. 1006-1008.

Shukuri, S et al., "A Semi-Static Complementary Gain Cell Technology for Sub-1 V Supply DRAM's," IEEE Transactions on Electron Devices, Jun. 1, 1994, vol. 41, No. 6, pp. 926-931.

International Search Report, PCT Application No. PCT/JP2010/069245, dated Jan. 25, 2011, 4 pages.

Written Opinion, PCT Application No. PCT/JP2010/069245, dated Jan. 25, 2011, 6 pages.

Barquinha, P et al., "Effect of UV and Visible Light Radiation on the Electrical Performances of Transparent TFTs Based on Amorphous Indium Zinc Oxide," J. Non-Cryst. Solids (Journal of Non-Crystalline Solids), Jun. 15, 2006, vol. 352, No. 9-20, pp. 1756-1760.

* cited by examiner

SEMICONDUCTOR MEMORY CELL HAVING AN OXIDE SEMICONDUCTOR TRANSISTOR AND ERASABLE BY ULTRAVIOLET LIGHT

TECHNICAL FIELD

The present invention relates to a memory, particularly a nonvolatile memory. The nonvolatile memory includes a transistor, and the transistor includes a channel formed using an oxide semiconductor.

BACKGROUND ART

A semiconductor device like that shown in FIG. 1 has been proposed as a memory using a TFT whose active layer is made of amorphous oxide. The semiconductor device includes a first transistor 20 and a second transistor 21. The first transistor is formed over a substrate containing a semiconductor material. The second transistor includes an oxide semiconductor film. In addition, Patent Document 1 discloses a ROM circuit using a TFT whose active layer is made of amorphous oxide.

REFERENCE

[Patent Document 1] Japanese Published Patent Application No. 2006-165532

DISCLOSURE OF INVENTION

In the semiconductor device like that shown in FIG. 1, data erasure is required.

One embodiment of the present invention provides a nonvolatile memory including a transistor whose channel is formed in an oxide semiconductor. In the nonvolatile memory, held data can easily be erased.

The present inventors have found, in the experiment described later, a phenomenon in which the relation between Vg (gate voltage) and Id (drain current) of a transistor whose channel is formed in an oxide semiconductor is different between before and after the transistor is irradiated with ultraviolet light. Then, this phenomenon was found to be capable of achieving the above-stated object.

Experiment

FIGS. 2A and 2B show an example of measurements of the relation between Vg (V (volt)) and Id (A (ampere)) of a transistor 10 whose channel is formed in an oxide semiconductor. FIG. 2A shows the case where Vd (drain voltage) is 1 V. A curve 1 is a Vg-Id curve obtained before the transistor is irradiated with ultraviolet light, a curve 2 is a Vg-Id curve obtained soon after the transistor is irradiated with ultraviolet light, and a curve 3 is a Vg-Id curve obtained after the transistor is left standing at room temperature for 40 hours from after the transistor is irradiated with ultraviolet light. FIG. 2B shows the case where Vd (drain voltage) is 10 V. A curve 4 is a Vg-Id curve obtained before the transistor is irradiated with ultraviolet light, a curve 5 is a Vg-Id curve obtained soon after the transistor is irradiated with ultraviolet light, and a curve 6 is a Vg-Id curve obtained after the transistor is left standing at room temperature for 40 hours from after the transistor is irradiated with ultraviolet light. A xenon lamp was used as a light source. Light intensity of the ultraviolet light was approximately 100,000 lx, and irradiation time was 30 minutes. The channel is made of amorphous In—Ga—Zn—O based oxide semiconductor material. The transistor 10 was a bottom-gate transistor (see FIG. 3).

The transistor 10 will be briefly described. The transistor 10 was formed over an insulating layer 12 over a substrate 11, and included a gate electrode 13, a gate insulating film 14, an oxide semiconductor layer 15, a source electrode 16, a drain electrode 17, and a passivation film 18. L/W of the channel was 3 μm/50 μm.

The method for fabricating the transistor 10 will be briefly described. A glass substrate (AN100 by Asahi Glass Co., Ltd.) was used as the substrate 11. A silicon oxide film with a thickness of 100 nm and a silicon oxynitride film with a thickness of 150 nm were deposited over the substrate 11 by CVD, forming the insulating layer 12.

A tungsten film with a thickness of 100 nm was deposited by sputtering, and the tungsten film was processed into an island shape, forming the gate electrode 13.

A silicon oxynitride film with a thickness of 100 nm was deposited by CVD to be the gate insulating film 14.

An In—Ga—Zn—O based oxide semiconductor film with a thickness of 30 nm was deposited by sputtering, and the oxide semiconductor film was processed into an island shape, forming the oxide semiconductor layer 15.

In a next step, heat treatment was performed in a nitrogen atmosphere at 450° C. for 60 minutes, or in a nitrogen atmosphere at 550° C. for 6 minutes.

To form a conductive film, a Ti film with a thickness of 100 nm was deposited by sputtering, an Al film with a thickness of 200 nm was deposited over the Ti film by sputtering, and a Ti film with a thickness of 100 nm was deposited over the Al film by sputtering. The conductive film was processed to form the source electrode 16 and the drain electrode 17.

The passivation film 18 with a thickness of 300 nm is deposited by sputtering.

In a next step, heat treatment was performed in a nitrogen atmosphere at 250° C. for 60 minutes. Note that contact holes were formed in the passivation film 18 and the gate insulating film 14, and then a wire being in contact with the source electrode 16, a wire being in contact with the drain electrode 17, and a wire being in contact with the gate electrode 13 were formed, as needed.

The curve 1 showed that in an initial state where Vd=1 V, the threshold voltage ($V_{th1}$) was higher than 0 V ($V_{th1}>0$). In addition, the transistor 10 was found to be a so-called normally-off transistor. The off-state current was confirmed to be 1.E-12 A or less, i.e. $1\times10^{-12}$ A or less, which is below the sensitivity limit of the measuring instrument. Considering that the off-state current of a transistor whose channel is formed using amorphous silicon is $10^{-11}$ to $10^{-9}$ A, the off-state current of the transistor 10 was found to be extremely low.

Next, the channel was irradiated with ultraviolet light coming from above the channel (see FIG. 3). Then, the Vg-Id curve changes from the curve 1 to the curve 2, and the threshold voltage ($V_{th2}$) became lower than 0 V ($V_{th2}<0$). The transistor 10 was thus found to be normally on.

In a next step, the transistor 10 was left standing at room temperature for 40 hours. Then, the Vg-Id curve changes from the curve 2 to the curve 3. The curve 3 showed that the threshold voltage ($V_{th3}$) was higher than 0 V ($V_{th3}>0$). The transistor 10 was thus found to become normally off again.

Note that even when Vd=10 V, similar results were obtained (see FIG. 2B). This shows that the obtained Vg-Id curves are unrelated to variations in Vd.

As described above, a transistor whose channel is formed in an oxide semiconductor is usually normally off, but the transistor becomes normally on when irradiated with ultraviolet light. After being left standing afterwards, the transistor becomes normally off again. The present inventors found that this phenomenon enabled data to easily be erased in a nonvolatile memory.

One embodiment of the present invention is a nonvolatile memory including a memory cell including a first transistor and a second transistor. The first transistor includes a first channel, a first gate electrode, a first source electrode, and a first drain electrode. The second transistor includes a second channel, a second gate electrode, a second source electrode, and a second drain electrode. The second channel is formed in an oxide semiconductor. One of the second source electrode and the second drain electrode is electrically connected to the first gate electrode. Data writing in the memory cell is done by raising the potential of a node between one of the second source electrode and the second drain electrode and the first gate electrode, or by storing charge in the node. Data erasure in the memory cell is done by irradiating the second channel with ultraviolet light and lowering the potential of the node, or by releasing charge from the node. Voltage of 0 V is applied to the second gate electrode. The second transistor is a normally-off transistor before the second transistor is irradiated with ultraviolet light. The second transistor is made a normally-on transistor by irradiating the second transistor with ultraviolet light.

One embodiment of the present invention is nonvolatile memory including a first memory cell, and a second memory cell. The first memory cell includes a first transistor, a second transistor, and a first capacitor. The first transistor includes a first channel, a first gate electrode, a first source electrode, and a first drain electrode. The second transistor includes a second channel, a second gate electrode, a second source electrode, and a second drain electrode. The second channel is formed in an oxide semiconductor. One of the second source electrode and the second drain electrode is electrically connected to the first gate electrode and one electrode of the first capacitor. The second memory cell includes a third transistor, a fourth transistor, and a second capacitor. The third transistor includes a third channel, a third gate electrode, a third source electrode, and a third drain electrode. The fourth transistor includes a fourth channel, a fourth gate electrode, a fourth source electrode, and a fourth drain electrode. The fourth channel is formed in an oxide semiconductor. One of the fourth source electrode and the fourth drain electrode is electrically connected to the third gate electrode and one electrode of the second capacitor. One of the first source electrode and the first drain electrode is the one of the third source electrode and the third drain electrode, or the one of the first source electrode and the first drain electrode is electrically connected to the one of the third source electrode and the third drain electrode. Data writing in the first memory cell is done by raising a potential of a node between one of the second source electrode and the second drain electrode, and the first gate electrode and a potential of the one electrode of the first capacitor, or by storing charge in the node. Data erasure in the first memory cell is done by irradiating the second channel with ultraviolet light and lowering the potential of the node and the potential of the one electrode of the first capacitor, or by releasing charge from the node. Data writing in the second memory cell is done by raising a potential of a node between one of the fourth source electrode and the fourth drain electrode, and the third gate electrode and a potential of the one electrode of the second capacitor, or by storing charge in the node. Data erasure in the second memory cell is done by irradiating the fourth channel with ultraviolet light and lowering the potential of the node and the potential of the one electrode of the second capacitor, or by releasing charge from the node. Voltage of 0 V is applied to the second gate electrode and the fourth gate electrode. The second transistor and the fourth transistor are normally-off transistors before the second transistor and the fourth transistor are irradiated with ultraviolet light. The second transistor and the fourth transistor are made normally-on transistors by irradiating the second transistor and the fourth transistor with ultraviolet light.

One embodiment of the present invention is nonvolatile memory including a memory cell including a first transistor, a second transistor, and a third transistor. The first transistor includes a first channel, a first gate electrode, a first source electrode, and a first drain electrode. The second transistor includes a second channel, a second gate electrode, a second source electrode, and a second drain electrode. The second channel is formed in an oxide semiconductor. The third transistor includes a third channel, a third gate electrode, a third source electrode, and a third drain electrode. One of the second source electrode and the second drain electrode is electrically connected to the first gate electrode. One of the first source electrode and the first drain electrode is the one of the third source electrode and the third drain electrode, or the one of the first source electrode and the first drain electrode is electrically connected to the one of the third source electrode and the third drain electrode. Data writing in the memory cell is done by raising a potential of a node between one of the second source electrode and the second drain electrode and the first gate electrode, or by storing charge in the node. Data erasure in the memory cell is done by irradiating the second channel with ultraviolet light and lowering the potential of the node, or by releasing charge from the node. Voltage of 0 V is applied to the second gate electrode. The second transistor is a normally-off transistor before the second transistor is irradiated with ultraviolet light. The second transistor is made a normally-on transistor by irradiating the second transistor with ultraviolet light.

One embodiment of the present invention is nonvolatile memory including a memory cell including a transistor and a capacitor. The transistor includes a channel, a gate electrode, a source electrode, and a drain electrode. The channel is formed in an oxide semiconductor. One of the source electrode and the drain electrode is electrically connected to one electrode of the capacitor. Data writing in the memory cell is done by raising a potential of a node between one of the source electrode and the drain electrode and the one electrode of the capacitor, or by storing charge in the node. Data erasure in the memory cell is done by irradiating the channel with ultraviolet light and lowering the potential of the node, or by releasing charge from the node. Voltage of 0 V is applied to the gate electrode. The transistor is a normally-off transistor before the transistor is irradiated with ultraviolet light. The transistor is made a normally-on transistor by irradiating the transistor with the ultraviolet light.

In one embodiment of the present invention, a transistor whose channel is formed in an oxide semiconductor is used for a nonvolatile memory. Even when voltage of 0 V is applied to the gate electrode of the transistor, data in the memory is easily erased. When the nonvolatile memory includes a plurality of memory cells, all the data therein can easily be erased at once.

BEST MODE FOR CARRYING OUT THE INVENTION

Figure 1:
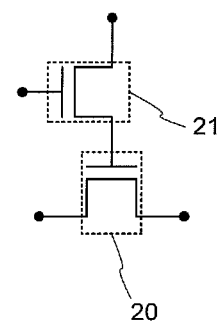
FIG. 1 is a diagram illustrating a semiconductor device.
Figure 2A:
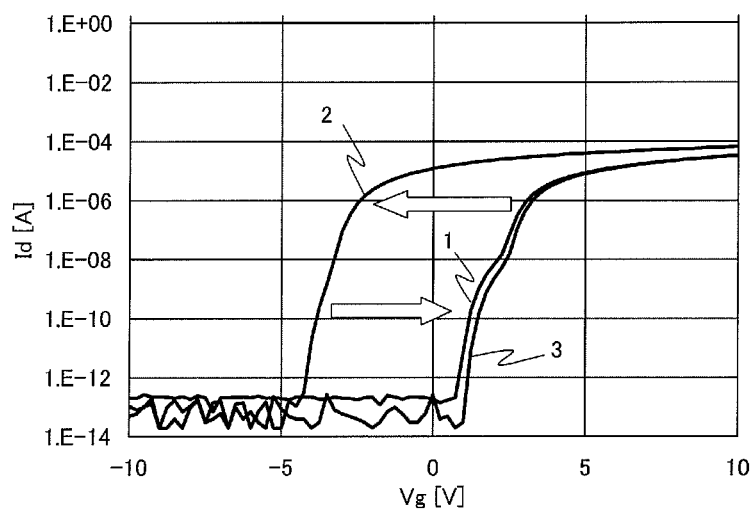
FIGS. 2A and 2B are graphs illustrating changes in threshold voltage.
Figure 2B:
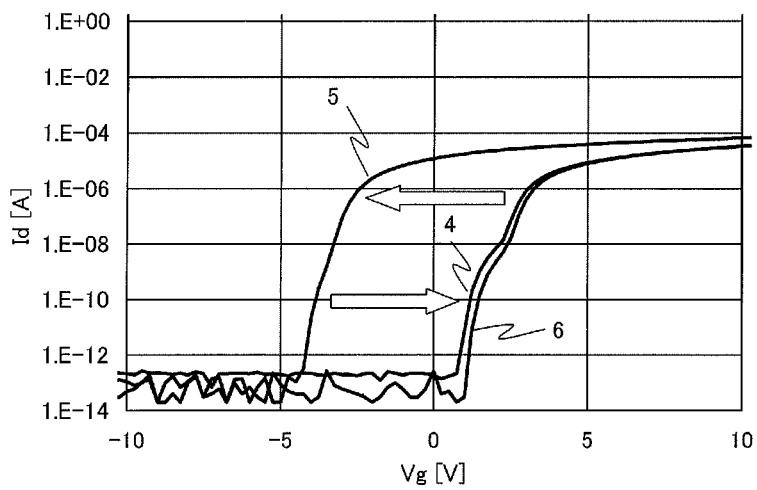
Figure 3:
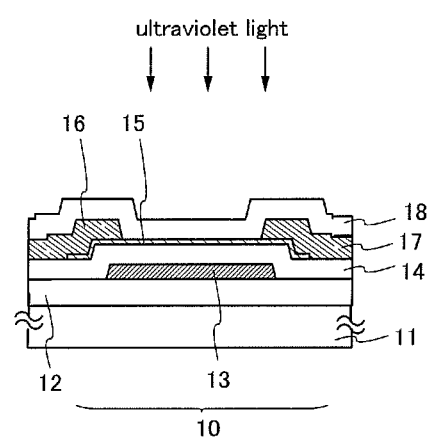
FIG. 3 is the cross-sectional view of a transistor 10.

In the accompanying drawings:

Embodiments of the present invention will be described below. However, the present invention can be carried out in many different modes, and it is easily understood by those skilled in the art that modes and details of the present invention can be modified in various ways without departing from the purpose and the scope of the present invention. Therefore, the present invention is not construed as being limited to description of the embodiments described below. Note that the same reference numerals are commonly given to the same portions or portions having similar functions in different drawings, and repetitive explanation will be omitted in some cases.

Embodiment 1

This embodiment is a nonvolatile memory including a memory cell including a first transistor and a second transistor. The first transistor includes a first channel, a first gate electrode, a first source electrode, and a first drain electrode. The second transistor includes a second channel, a second gate electrode, a second source electrode, and a second drain electrode. The second channel is formed in an oxide semiconductor. One of the second source electrode and the second drain electrode is electrically connected to the first gate electrode. Data writing in the memory cell is done by raising the potential of a node between one of the second source electrode and the second drain electrode and the first gate electrode, or by storing charge in the node. Data erasure in the memory cell is done by irradiating the second channel with ultraviolet light and lowering the potential of the node, or by releasing charge from the node.

Figure 4:
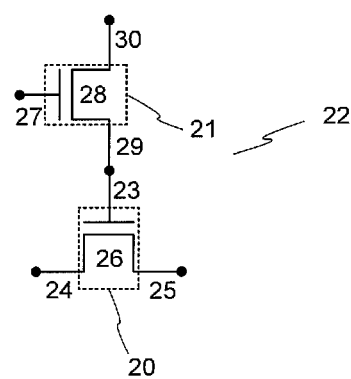
FIG. 4 is a diagram illustrating an equivalent circuit of a nonvolatile memory.

A memory cell 22 includes the first transistor 20 and the second transistor 21 (see FIG. 4). The first transistor 20 includes a first channel 26, a first gate electrode 23, an electrode 24 (one of the first source electrode and the first drain electrode), and an electrode 25 (the other one of the first source electrode and the first drain electrode). The second transistor 21 includes a second channel 28, a second gate electrode 27, an electrode 29 (one of the second source electrode and the second drain electrode), and an electrode 30 (the other one of the second source electrode and the second drain electrode). The electrode 29 is electrically connected to the first gate electrode 23. Alternatively, the electrode 29 and the first gate electrode 23 can be made of the same wire.

The material for the second channel 28 includes an oxide semiconductor. The first channel 26 is made of a material other than oxide semiconductor material, e.g. one selected from silicon, germanium, silicon-germanium, silicon-carbon, gallium arsenide, and the like. The first transistor 20 using a material other than an oxide semiconductor, which is single crystal silicon, germanium, silicon-germanium, silicon-carbon, or gallium-arsenide in particular, is capable of adequately high-speed operation, and thus enables high-speed data reading and the like. Note that the second transistor 21 including an oxide semiconductor layer offers extremely low off-state current. Hence, when the second transistor 21 is off, the potential of the first gate electrode 23 of the first transistor 20 can be held for extremely long periods of time. In other words, even when no potential is applied to the second gate electrode 27 (the power is turned off), data remains held. Thus, a nonvolatile memory is achieved.

Since the potential of the first gate electrode 23 can be held, data writing, data holding, and data reading are achieved. Further, data can easily be erased by ultraviolet irradiation.

(Method of Operation)

The operation of the memory cell 22 will be described. Here, the first transistor 20 and the second transistor 21 are n-type transistors.

1. Data Writing, Data Holding, and Data Reading

Figure 5A:
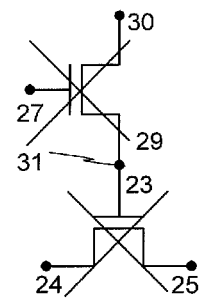
FIGS. 5A to 5C are diagrams illustrating the operation of a nonvolatile memory.

In an initial state, the first transistor 20 and the second transistor 21 are off (see FIG. 5A).

Figure 5B:
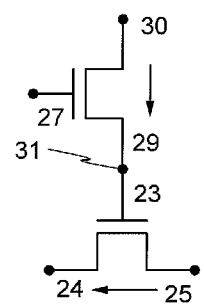

Voltage ($V_{G2}$) is applied to the second gate electrode 27, and the second transistor 21 is turned on. This holds for $V_{G2} \geq$ the threshold voltage of the second transistor 21 ($V_{TH2}$) (the voltage $V_{G2}$ is higher than or equal to the voltage $V_{TH2}$). When the second transistor 21 is turned on, the potential of the electrode 30 ($V_{SD2}$) is applied to the node 31 between the electrode 29 and the first gate electrode 23, whereby the potential of the node 31 is increased. Charge is stored in the node 31 through the electrode 30 and the electrode 29. Since the node 31 and the first gate electrode 23 have the same potential, the first transistor 20 is turned on when $V_{SD2}$ is applied to the first gate electrode 23. This holds for $V_{SD2} \geq$ the threshold voltage of the first transistor 20 ($V_{TH1}$) (the voltage $V_{SD2}$ is higher than or equal to the voltage $V_{TH1}$). When the first transistor 20 is turned on, current flows from the electrode 25 to the electrode 24 (see FIG. 5B, data writing).

Figure 5C:
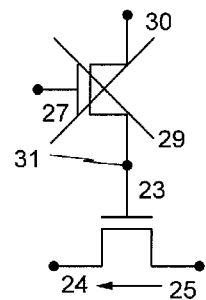

In a next step, the potential at which the second transistor 21 is turned off, e.g. 0 V, is applied to the second gate electrode 27, and the second transistor 21 is thereby turned off. This holds for $0 < V_{TH2}$. As stated above, the off-state current of the second transistor 21 is extremely low, so that the potential of the node 31 is not decreased but held. Charge stored in the node 31 is held. Since the node 31 and the first gate electrode 23 have the same potential, the first transistor 20 remains on and current keeps flowing therethrough (see FIG. 5C, data holding and data reading). A capacitor may further be provided to the node 31 in order to hold charge.

In the case where the potential of the node 31, i.e. the potential of the first gate electrode 23, is the potential at which the first transistor 20 is turned off and the second transistor 21 is off, the potential of the node 31 is not increased but held since the off-state current of the second transistor 21 is extremely low. Charge is not stored in the node 31. The first transistor 20 remains off.

2. Data Erasure

Figure 6A:
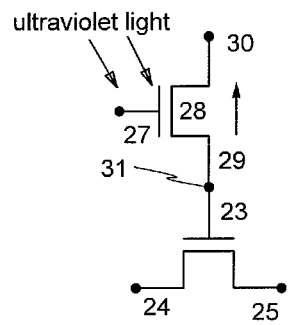
FIGS. 6A to 6C are diagrams illustrating the operation of a nonvolatile memory.

The second channel 28 of the second transistor 21 is irradiated with ultraviolet light. The second transistor 21 is normally off without being irradiated with ultraviolet light. However, when the second transistor 21 is irradiated with ultraviolet light, the second transistor 21 becomes normally on, i.e. on state, (see FIG. 6A). The second transistor 21 becomes on even when voltage of 0 V is applied to the second gate electrode 27. The second transistor 21 remains on even when ultraviolet irradiation is stopped.

Figure 6B:
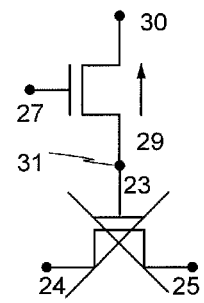
Figure 6C:
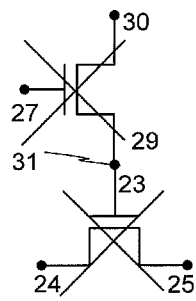

At that time, the potential of the electrode 30 is decreased to lower than the potential of the node 31. Since the second transistor 21 is on, the potential of the second node 31 is decreased. Charge stored in the second node 31 is released. Since the node 31 and the first gate electrode 23 have the same potential, the first transistor 20 is turned off (see FIG. 6B, data erasure). In a next step, the second transistor 21 is left standing, so that the second transistor 21 becomes normally off (see FIG. 6C). As described above, even when voltage of 0 V is applied to the second gate electrode 27, the data can be erased only by ultraviolet irradiation. Although data erasure in the memory cell 22 is described here, in the case where a memory includes a plurality of memory cells 22, all data in the memory cells 22 can be erased at once by irradiating all the second transistors 21 with ultraviolet light.

The wavelength of the ultraviolet light ranges from 10 nm to 400 nm. A commercial UV lamp, a commercial excimer laser, or the like is used as the light source. The irradiation intensity and the irradiation time depend on the wavelength and the light source, and may be approximately 10,000 to 200,000 1×, and approximately 1 to 60 minutes, respectively, for example.

(The Configuration of the Memory Cell)

Next, the first transistor 20 and the second transistor 21 in the memory cell 22 will be described (see FIGS. 7A and 7B).

Figure 7A:
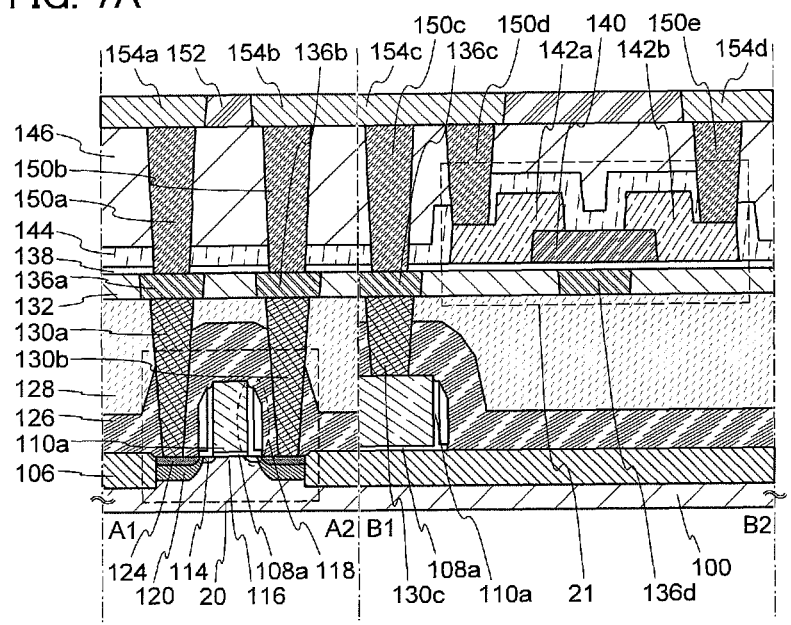
FIGS. 7A and 7B are the cross-sectional view and top view of a nonvolatile memory.

FIG. 7A is the cross-sectional view of the memory cell 22. FIG. 7B is the plane view of the memory cell 22. FIG. 7A shows section A1-A2 and section B1-B2 in FIG. 7B. The memory cell 22 shown in FIGS. 7A and 7B includes the first transistor 20 in its lower part, which is formed using a material other than an oxide semiconductor, and the second transistor 21 in its upper part, which is formed using an oxide semiconductor. Note that although the first transistor 20 and the second transistor 21 are n-type transistors here, they can alternatively be p-type transistors. It is easy to make the first transistor 20 a p-type transistor.

The first transistor 20 includes a first channel 116 formed in a semiconductor substrate 100 formed using single crystal silicon or the like, impurity regions 114 and heavily doped regions 120 (collectively called simply impurity regions) between which a first channel 116 is interposed, a first gate insulating layer 108a over the first channel 116, a first gate electrode 110a over the first gate insulating layer 108a, an electrode 130a (one of the first source electrode and the first drain electrode) electrically connected to one of the impurity regions 114, and an electrode 130b (the other one of the first source electrode and the first drain electrode) electrically connected to one of the impurity regions 114.

Side wall insulating layers 118 are formed on the sides of the first gate electrode 110a. Moreover, the heavily doped regions 120 are formed in the semiconductor substrate 100 so as not to overlap with the side wall insulating layers 118, when seen from above, and metal compound regions 124 are present over the heavily doped regions 120. An element isolation insulating layer 106 is formed over the substrate 100 so as to surround the first transistor 20. An interlayer insulating layer 126 and an interlayer insulating layer 128 are formed so as to cover the first transistor 20. The electrode 130a and the electrode 130b are each electrically connected to the metal compound region 124 through the opening in the interlayer insulating layer 126 and the interlayer insulating layer 128. The electrode 130a and the electrode 130b are each electrically connected to the heavily doped region 120 and the impurity region 114 through the metal compound region 124. The first gate electrode 110a is electrically connected to an electrode 130c formed at the same time as the electrode 130a or the electrode 130b.

The second transistor 21 includes a second gate electrode 136d over the interlayer insulating layer 128; a second gate insulating layer 138 over the second gate electrode 136d; an oxide semiconductor layer 140 over the second gate insulating layer 138; and an electrode 142a (one of the second source electrode and the second drain electrode) and an electrode 142b (the other one of the second source electrode and the second drain electrode) which are over the oxide semiconductor layer 140 and are electrically connected to the oxide semiconductor layer 140. A second channel 28 is formed in the oxide semiconductor layer 140. The oxide semiconductor layer 140 is irradiated with ultraviolet light coming from above the oxide semiconductor layer 140.

Here, the second gate electrode 136d is formed so as to be embedded in an insulating layer 132 which is over the interlayer insulating layer 128. Further, as in the case of the second gate electrode 136d, an electrode 136a is formed so as to be in contact with the electrode 130a, an electrode 136b is formed so as to be in contact with the electrode 130b, and an electrode 136c is formed so as to be in contact with the electrode 130c.

A protective insulating layer 144 is formed over the second transistor 21 so as to be in contact with part of the oxide semiconductor layer 140. An interlayer insulating layer 146 is formed over the protective insulating layer 144. Openings reaching the electrode 142a and the electrode 142b are provided in the protective insulating layer 144 and the interlayer insulating layer 146. An electrode 150d and an electrode 150e are formed so as to be in contact with the electrode 142a and the electrode 142b through the openings, respectively. As in the case of the electrode 150d and the electrode 150e, an electrode 150a, an electrode 150b, and an electrode 150c are formed so as to be in contact with the electrode 136a, the electrode 136b, and the electrode 136c respectively, through openings in the second gate insulating layer 138, the protective insulating layer 144, and the interlayer insulating layer 146.

An insulating layer 152 is formed over the interlayer insulating layer 146. An electrode 154a, an electrode 154b, an electrode 154c, and an electrode 154d are formed so as to be embedded in the insulating layer 152. Here, the electrode 154a is in contact with the electrode 150a, the electrode 154b is in contact with the electrode 150b, the electrode 154c is in contact with the electrodes 150c and 150d, and the electrode 154d is in contact with the electrode 150e.

The first gate electrode 110a of the first transistor 20 is electrically connected to the electrode 142a (one of the second source electrode and the second drain electrode) of the second transistor 21 through the electrode 130c, the electrode 136c, the electrode 150c, the electrode 154c, and the electrode 150d.

Next, the method for fabricating the above memory cell will be described. First, the method for fabricating the first transistor 20 in the lower part will be described with reference to FIGS. 8A to 8H, and then, the method for fabricating the second transistor 21 in the upper part will be described below with reference to FIGS. 9A to 9G and FIGS. 10A to 10D.

(Method for Fabricating the First Transistor 20)

Figure 8A:
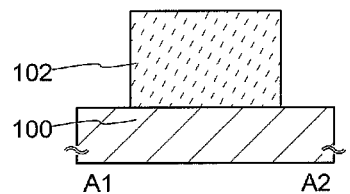
FIGS. 8A to 8H are diagrams illustrating the method for fabricating a nonvolatile memory.
Figure 8B:
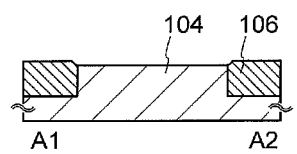

A substrate 100 which contains a semiconductor material is prepared (see FIG. 8A). A single crystal semiconductor substrate of silicon, carbon silicon, or the like; a microcrystalline semiconductor substrate; a compound semiconductor substrate of silicon germanium or the like; an SOI substrate, or the like can be used as the substrate 100 which contains a semiconductor material. Here, an example of the case where a single crystal silicon substrate is used as the substrate 100 which contains a semiconductor material is described. Note that in general, the term "SOI substrate" means a semiconductor substrate having a silicon semiconductor layer over its insulating surface. In this specification and the like, the term "SOI substrate" also means a substrate having a semiconductor layer using a material other than silicon over its insulating surface. In other words, a semiconductor layer included in the "SOI substrate" is not limited to a silicon semiconductor layer. Examples of the SOI substrate include an insulating substrate such as glass having a semiconductor layer over its surface, with an insulating layer between the semiconductor layer and the insulating substrate.

A protective layer 102 that serves as a mask for forming an insulating element insulating layer is formed over the substrate 100 (see FIG. 8A). An insulating layer of silicon oxide, silicon nitride, silicon nitride oxide, or the like, for example, is used as the protective layer 102. Further, resist mask can be also used as the protective layer 102. Note that before and after this step, an impurity element giving n-type conductivity or an impurity element giving p-type conductivity can be added to the substrate 100 in order to control the threshold voltage of the transistor. In the case where silicon is used as the semiconductor, phosphorus, arsenic, or the like is used as an impurity giving n-type conductivity. On the other hand, boron, aluminum, gallium, or the like is used as an impurity giving p-type conductivity.

A region of the substrate 100 which is not covered with the protective layer 102 (exposed region) is etched using the protective layer 102 as a mask. An isolated semiconductor region 104 is formed (see FIG. 8B). Although dry etching is preferably employed as the etching, wet etching can also be employed as the etching. An etching gas and an etchant are selected as appropriate in accordance with a material of layers to be etched.

An insulating layer is formed so as to cover the semiconductor region 104. A region of the insulating layer which overlaps with the semiconductor region 104 is selectively etched, forming insulating insulation insulating layer 106 (see FIG. 8B). The insulating layer is formed using silicon oxide, silicon nitride, silicon nitride oxide, or the like. Methods for removing the insulating layer over the semiconductor region 104 include etching, polishing such as CMP, and the like, and any of these are applicable. Note that after the semiconductor region 104 is formed or after the insulating insulation insulating layer 106 are formed, the protective layer 102 is removed (see FIG. 8B).

An insulating layer is formed over the semiconductor region 104, and a layer containing a conductive material is formed over the insulating layer.

It is recommended that the insulating layer, which is to be the first gate insulating layer, has a single-layer structure or a layered structure of films containing silicon oxide, silicon nitride oxide, silicon nitride, hafnium oxide, aluminum oxide, tantalum oxide, or the like obtained by CVD, sputtering, or the like. Alternatively, the insulating layer can be formed by oxidizing or nitriding a surface of the semiconductor region 104 by high-density plasma treatment or thermal oxidation treatment. The high-density plasma treatment is performed using a rare gas such as He, Ar, Kr, or Xe and a mixed gas of oxygen, nitrogen oxide, ammonia, nitrogen, hydrogen, or the like, for example. There is no particular limitation on the thickness of the insulating layer; the thickness of the insulating layer ranges from 1 to 100 nm, for example.

The layer containing a conductive material is formed using a metal material such as aluminum, copper, titanium, tantalum, and tungsten. Alternatively, the layer containing a conductive material can be formed using a semiconductor material such as polycrystalline silicon containing a conductive material. There is no particular limitation on the method for forming the layer containing a conductive material; a variety of deposition methods, such as vapor deposition, CVD, sputtering, and spin coating are applicable. Note that in this embodiment, an example of a case where the layer containing a conductive material is formed using a metal material is described.

Figure 8C:
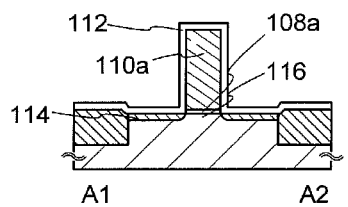

After that, the insulating layer and the layer containing a conductive material are selectively etched, thereby forming the first gate insulating layer 108a and the first gate electrode 110a (see FIG. 8C).

An insulating layer 112 which covers the first gate electrode 110a is formed (see FIG. 8C). Then, phosphorus (P), arsenic (As), or the like is added to the semiconductor region 104, forming impurity regions 114 with a shallow junction depth (see FIG. 8C). Note that although phosphorus or arsenic is added to form an n-type transistor here, in the case of forming a p-type transistor an impurity such as boron (B) or aluminum (Al) is added. By forming the impurity regions 114, the first channel 116 is formed in a portion of the semiconductor region 104 which is below the first gate insulating layer 108a (see FIG. 8C). The concentration of the added impurity is set as appropriate. The concentration thereof is raised when the semiconductor element is highly integrated. Although a process in which the impurity regions 114 are formed after the insulating layer 112 is formed is employed here, a process in which the insulating layer 112 is formed after the impurity regions 114 are formed can alternatively be employed.

Figure 8D:
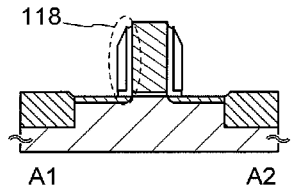
Figure 8E:
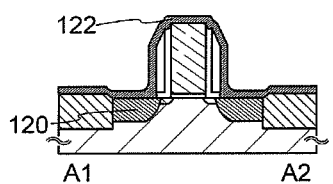
Figure 8F:
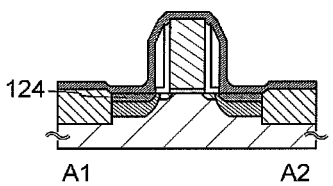

Side wall insulating layers 118 are formed (see FIG. 8D). The side wall insulating layers 118 are formed in a self-aligned manner by forming an insulating layer covering the insulating layer 112 and then performing highly anisotropic etching on the insulating layer. The insulating layer 112 is partly etched, so that a top surface of the first gate electrode 110a and a top surface of the impurity regions 114 are exposed.

An insulating layer is formed so as to cover the first gate electrode 110a, the impurity regions 114, the side wall insulating layers 118, and the like. Then, phosphorus (P), arsenic (As), or the like is added to a region where the insulating layer is in contact with the impurity regions 114, thereby forming heavily doped regions 120 (see FIG. 8E). After that, the insulating layer is removed, and a metal layer 122 is formed so as to cover the first gate electrode 110a, the side wall insulating layers 118, the heavily doped regions 120, and the like (see FIG. 8E). The metal layer 122 is formed by a variety of methods, such as vacuum deposition, sputtering, and spin coating. It is preferable that the metal layer 122 be formed using a metal material which, by reacting with a semiconductor material included in the semiconductor region 104, may become a metal compound having low resistance. Examples of such metal materials include titanium, tantalum, tungsten, nickel, cobalt, and platinum.

Heat treatment is performed, so that the metal layer 122 reacts with the semiconductor material. Metal compound regions 124 which are in contact with the heavily doped regions 120 are formed (see FIG. 8F). Note that when the polycrystalline silicon or the like is used for the first gate electrode 110a, a metal compound region is also formed in a portion where the first gate electrode 110a is in contact with the metal layer 122.

For example, irradiation with a flash lamp is used for the above heat treatment. Another heat treatment is acceptable; a method which realizes brief periods of heat treatment is preferably used in order to improve the controllability of chemical reaction relating to the formation of the metal compound. Note that the metal compound regions have adequately high conductivity because they are formed by the reaction of the metal material and the semiconductor material. The metal compound regions can adequately reduce electric resistance and improve element characteristics. Note that the metal layer 122 is removed after the metal compound regions 124 are formed.

Figure 8G:
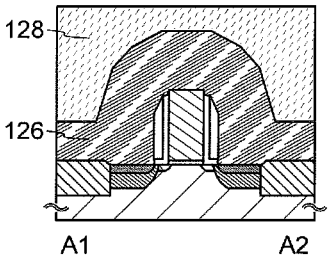

An interlayer insulating layer 126 and an interlayer insulating layer 128 are formed so as to cover the elements formed in the above steps (see FIG. 8G). The interlayer insulating layers 126 and 128 are formed using a material including an inorganic insulating material, such as silicon oxide, silicon nitride oxide, silicon nitride, hafnium oxide, aluminum oxide, and tantalum oxide. Alternatively, an organic insulating material such as polyimide and acrylic can be used. Although the interlayer insulating layer 126 and the interlayer insulating layer 128 form a two-layer structure, the structure of the interlayer insulating layers is not limited to this. After the interlayer insulating layer 128 is formed, a surface thereof is preferably flattened by CMP, etching, or the like.

Figure 8H:
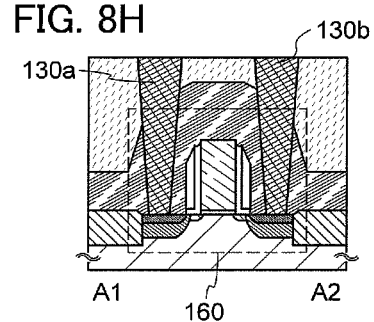

Openings which reach the metal compound regions 124 are formed in the interlayer insulating layers 126 and 128, and the electrode 130a (one of the first source electrode and the first drain electrode) and the electrode 130l3 (the other one of the first source electrode and the first drain electrode) are formed in the openings (see FIG. 8H). For example, the electrode 130a and the electrode 130b are formed in the following manner: a conductive layer is formed in a region including the openings by PVD, CVD, or the like, and then, the conductive layer is partly removed by etching, CMP, or the like.

In the case where the electrode 130a and the electrode 130b are formed by removing part of the conductive layer, it is preferable that a surface thereof be processed to be flat. For example, in the case of forming a tungsten film embedded in openings after a thin titanium film or a thin titanium nitride film has been formed in a region including the openings, CMP performed afterwards can remove unnecessary part of tungsten, titanium, titanium nitride, and the like, and improve the flatness of the surface. Adequate electrodes, wirings, insulating layers, semiconductor layers, or the like can be formed in the later steps by such an improvement in the flatness of a surface including the electrode 130a and the electrode 130b.

Although only the electrode 130a and the electrode 130b which are in contact with the metal compound regions 124 are shown here, an electrode which is to be in contact with the first gate electrode 110a (e.g. the electrode 130c in FIGS. 7A and 7B) or the like is formed in the same formation step. A variety of conductive materials are applicable to the electrode 130a and the electrode 130b. For example, a conductive material such as molybdenum, titanium, chromium, tantalum, tungsten, aluminum, copper, neodymium, and scandium is used.

The above process allows the first transistor 20 to be formed. Note that after the above process, an additional electrode, wiring, insulating layer, or the like can be formed. Multilayer interconnection structure using a layered structure of an interlayer insulating layer and a conductive layer provides a highly integrated memory cell and nonvolatile memory.

(Method for Fabricating the Second Transistor 21)

Next, a process of forming the second transistor 21 over the interlayer insulating layer 128 will be described (see FIGS. 9A to 9G and FIGS. 10A to 10D). In FIGS. 9A to 9G and FIGS. 10A to 10D, the first transistor 20 which is present below the second transistor 21 is omitted.

Figure 9A:
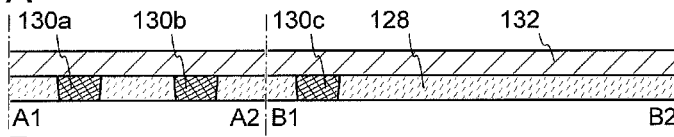
FIGS. 9A to 9G are diagrams illustrating the method for fabricating a nonvolatile memory.
Figure 9B:
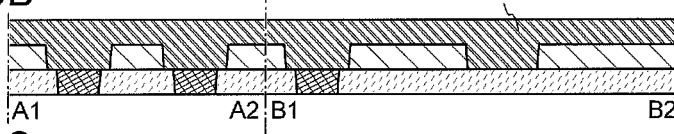

An insulating layer 132 is formed over the interlayer insulating layer 128, the electrode 130a, the electrode 130b, and the electrode 130c (see FIG. 9A). The insulating layer 132 is formed by PVD, CVD, or the like. The insulating layer 132 is formed using a material containing an inorganic insulating material such as silicon oxide, silicon nitride oxide, silicon nitride, hafnium oxide, aluminum oxide, and tantalum oxide.

An opening reaching the electrode 130a, an opening reaching the electrode 130b, and an opening reaching the electrode 130c are formed in the insulating layer 132. At that time, an additional opening is formed in a region where the second gate electrode 136d will be formed. Then, a conductive layer 134 is formed so as to fill the openings (see FIG. 9B). The openings can be formed by etching or the like using a mask. The mask is made by exposures using a photomask, for example. Either wet etching or dry etching can be used as the etching; in view of the fine patterning, dry etching is preferable. The conductive layer 134 is formed by a deposition method such as PVD and CVD. Examples of the material for the conductive layer 134 include a conductive material such as molybdenum, titanium, chromium, tantalum, tungsten, aluminum, copper, neodymium, and scandium; and an alloy and compound (e.g. nitride) of any of these materials.

For example, a thin titanium film is formed by PVD in a region including openings, a thin titanium nitride film is formed by CVD, and a tungsten film is formed so as to fill the openings. The titanium film formed by PVD reduces an oxide film at an interface with a lower electrode (here, the electrode 130a, the electrode 130b, the electrode 130c, or the like), and thus reduces contact resistance to the lower electrode. The titanium nitride film to be formed afterwards has a barrier function of blocking diffusion of the conductive material. After a barrier film formed using titanium, titanium nitride, or the like is formed, a copper film can be formed by plating.

Figure 9C:
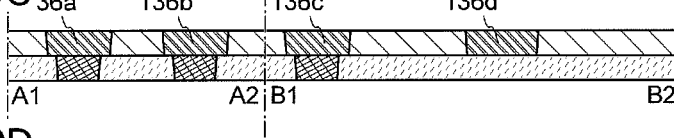

After the conductive layer 134 is formed, part of the conductive layer 134 is removed by etching or CMP, and the insulating layer 132 is thus exposed, thereby forming the electrode 136a, the electrode 136b, the electrode 136c, and the second gate electrode 136d (see FIG. 9C). Note that when the electrode 136a, the electrode 136b, the electrode 136c, and the second gate electrode 136d are formed by removing part of the conductive layer 134, it is preferable that a top surface of the insulating layer 132, the electrode 136a, the electrode 136b, the electrode 136c, and the second gate electrode 136d be processed to be flat. Adequate electrodes, wirings, insulating layers, semiconductor layers, or the like can be formed in the later steps by such an improvement in the flatness of the surface of the insulating layer 132, the electrode 136a, the electrode 136b, the electrode 136c, and the second gate electrode 136d.

Figure 9D:
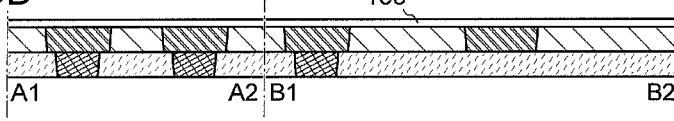

The second gate insulating layer 138 is formed so as to cover the insulating layer 132, the electrode 136a, the electrode 136b, the electrode 136c, and the second gate electrode 136d (see FIG. 9D). The second gate insulating layer 138 is formed by CVD, sputtering, or the like. The second gate insulating layer 138 contains silicon oxide, silicon nitride, silicon oxynitride, silicon nitride oxide, aluminum oxide, hafnium oxide, tantalum oxide, or the like. The second gate insulating layer 138 has either a single-layer structure or a layered structure. For example, the second gate insulating layer 138 of silicon oxynitride can be formed by plasma CVD using silane oxygen, and nitrogen as a source gas. There is no particular limitation on the thickness of the second gate insulating layer 138; the thickness can range from 10 to 500 nm, for example. When the layered structure is employed, the second gate insulating layer 138 preferably has a gate insulating layer A with a thickness ranging from 50 to 200 nm and a gate insulating layer B with a thickness ranging from 5 to 300 nm which is over the gate insulating layer A.

An i-type or substantially i-type oxide semiconductor achieved by the removal of impurities (an oxide semiconductor of high purity) is extremely sensitive to interface state density or interface charge. An interface between an oxide semiconductor layer and the second gate insulating layer 138 is an important factor in the case where such an oxide semiconductor is used for the oxide semiconductor layer. In other words, the second gate insulating layer 138 which is in contact with an oxide semiconductor layer of high purity needs to be of high quality.

For example, high-density plasma CVD using microwaves (2.45 GHz) produces the compact high-quality second gate insulating layer 138 of high withstand voltage. A close contact between an oxide semiconductor layer with high purity and a high-quality gate insulating layer reduces interface state density and produces adequate interface characteristics.

Another method such as sputtering and plasma CVD is applicable as long as the adequate second gate insulating layer 138 can be formed. An insulating layer the quality or interface characteristics of which can be improved by heat treatment can be used.

In addition, hydrogen, hydroxyl groups, or moisture is prevented from being contained in the second gate insulating layer 138. It is preferable that pretreatment is performed as follows: the substrate 100 is preheated in a preheating chamber of a sputtering apparatus and impurities such as hydrogen, water, hydroxyl groups, and hydride adsorbed on the substrate 100 are removed from the preheating chamber. The temperature for the preheating ranges from 100 to 400° C., and preferably ranges from 150 to 300° C. An evacuation unit provided with the preheating chamber is preferably a cryopump. Note that this preheating treatment can be omitted.

The concentration of halogen (e.g. fluorine or chlorine) in the second gate insulating layer 138 can be approximately $5 \times 10^{18}$ atoms/cm$^3$ to $1 \times 10^{20}$ atoms/cm$^3$. Halogen makes it possible to remove impurities such as hydrogen, moisture, hydroxyl groups, and hydride which may be present in the oxide semiconductor layer 140 or at the interface between the second gate insulating layer 138 and the oxide semiconductor layer 140.

Figure 9E:
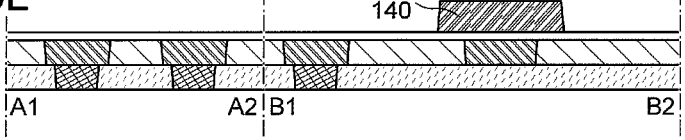

An oxide semiconductor layer is formed over the second gate insulating layer 138, and the oxide semiconductor layer is processed by etching using a mask or the like, forming the island-shaped oxide semiconductor layer 140 (see FIG. 9E).

Such an oxide semiconductor layer is preferably an oxide semiconductor layer, especially an amorphous oxide semiconductor layer using one of an In—Ga—Zn—O-based oxide semiconductor, an In—Sn—Zn—O-based oxide semiconductor, an In—Al—Zn—O-based oxide semiconductor, a Sn—Ga—Zn—O-based oxide semiconductor, an Al—Ga—Zn—O-based oxide semiconductor, a Sn—Al—Zn—O-based oxide semiconductor, an In—Zn—O-based oxide semiconductor, a Sn—Zn—O-based oxide semiconductor, an Al—Zn—O-based oxide semiconductor, an In—O-based oxide semiconductor, a Sn—O-based oxide semiconductor, and a Zn—O-based oxide semiconductor. In this embodiment, an amorphous oxide semiconductor layer is formed as the oxide semiconductor layer by sputtering, using an In—Ga—Zn—O-based oxide semiconductor target. The addition of silicon to an amorphous oxide semiconductor layer suppress the crystallization of the layer; therefore, the oxide semiconductor layer can be formed using a target containing SiO$_2$ at 2 to 10 wt. %.

Such a target for forming the oxide semiconductor layer by sputtering can be a metal oxide target whose main component is zinc oxide, or an oxide semiconductor target containing In, Ga, and Zn (a composition ratio is In$_2$O$_3$:Ga$_2$O$_3$:ZnO=1:1:1 [molar ratio]). The composition ratio of the oxide semiconductor target containing In, Ga, and Zn can be In$_2$O$_3$:Ga$_2$O$_3$:ZnO=1:1:2 [molar ratio] or In$_2$O$_3$:Ga$_2$O$_3$:ZnO=1:1:4 [molar ratio]. The filling factor of the oxide semiconductor target is 90 to 100%, and preferably 95% or more (e.g. 99.9%). An oxide semiconductor target with a high filling factor produces a compact oxide semiconductor layer.

Hydrogen, hydroxyl groups, or moisture is preferably prevented from being contained in the oxide semiconductor layer. Specifically, the concentration of hydrogen is $5 \times 10^{19}$/cm$^3$ or less, and preferably $5 \times 10^{18}$/cm$^3$ or less, and more preferably less than $5 \times 10^{16}$/cm$^3$. Carrier concentration at 300 K is $5 \times 10^{14}$/m$^3$ or less, and preferably $1 \times 10^{14}$/cm$^3$ or less, and more preferably $5 \times 10^{12}$/cm$^3$ or less, and still more preferably $1 \times 10^{12}$/cm$^3$ or less. In other words, carrier concentration in the oxide semiconductor layer is as close to zero as possible. Further, the energy gap of the oxide semiconductor is 2 eV or more, and preferably 2.5 eV or more, and more preferably 3 eV or more. Note that the concentration of hydrogen in the oxide semiconductor layer can be measured by secondary ion mass spectroscopy (SIMS). The carrier concentration can be measured by Hall effect measurement.

It is known that the hydrogen atom acts as a donor in an oxide semiconductor and is a factor that causes an oxide semiconductor to have n-type conductivity. Hence, it is possible to provide an i-type oxide semiconductor (an intrinsic oxide semiconductor) by removing hydrogen from an oxide semiconductor and by making the oxide semiconductor of high purity so that the oxide semiconductor may contain as few impurities, except for its main component, as possible. It is preferable to provide an i-type oxide semiconductor (an intrinsic oxide semiconductor) by removing impurities such as hydrogen and water as many as possible from an oxide semiconductor, not by adding an impurity to an oxide semiconductor. The Fermi level ($E_F$) of an oxide semiconductor from which impurities have been removed can be extremely close to the intrinsic Fermi level ($E_i$).

The second transistor 21 including the oxide semiconductor layer offers low off-state current even when negative potential is applied to the second gate electrode 136d (even when reverse-bias is applied to the second transistor 21). When negative potential is applied to the second gate electrode 136d, off-state current flows because of holes. In the second transistor 21, however, the concentration of all carriers is low, so that the minority carrier concentration (hole concentration) which contributes to the off-state current is low; therefore, the off-state current is low.

The atmosphere for the deposition of the oxide semiconductor layer is preferably a rare gas (typically argon) atmosphere, an oxygen atmosphere, or a mixed atmosphere of a rare gas (typically argon) and oxygen. Specifically, is preferable a high-purity gas, in which the concentration of impurities such as hydrogen, water, hydroxyl, and hydride is so reduced that it is approximately in parts per million (preferably in parts per billion).

For the deposition of the oxide semiconductor layer, a substrate is set in a chamber at reduced pressure and the substrate temperature is set to be between 100 and 600° C., and preferably between 200 and 400° C. Depositing the oxide semiconductor layer while heating the substrate reduces the concentration of impurities contained in the deposited oxide semiconductor layer and also reduces damage to the layer due to sputtering. Then, moisture remaining in the treatment chamber is removed at the same time as the introduction of a sputtering gas from which hydrogen and water are removed into the treatment chamber where a metal oxide is used as a target, thereby forming an oxide semiconductor layer. In order to remove remaining moisture in the treatment chamber, a sorption vacuum pump is preferably used. For example, a cryopump, an ion pump, or a titanium sublimation pump is preferably used. The evacuation unit can be a turbo pump provided with a cold trap. A hydrogen atom, a compound containing a hydrogen atom, such as water ($H_2O$), (more preferably also a compound containing a carbon atom), and the like are removed from the deposition chamber when evacuated with a cryopump, thereby reducing the impurity concentration in the oxide semiconductor layer formed in the deposition chamber.

For example, the deposition condition is as follows: the distance between a substrate and a target is 100 mm, the pressure is 0.6 Pa, the direct-current (DC) power is 0.5 kW, and the atmosphere is an oxygen atmosphere (the proportion of oxygen in the oxygen flow rate is 100%). Note that the use of a pulse direct-current (DC) power source is preferable in that it reduces dust which occurs at the time of the deposition and in that it makes the film thickness even. The thickness of the oxide semiconductor layer preferably ranges from 2 to 200 nm, and preferably 5 to 30 nm. Note that the appropriate thickness changes depending on the oxide semiconductor material used, and hence the thickness is selected as appropriate depending on the material used.

Note that before the oxide semiconductor layer is formed by sputtering, dust attached to a surface of the second gate insulating layer 138 is preferably removed by reverse sputtering where plasma is generated by the introduction of an argon gas. Here the reverse sputtering means a method for improving the quality of a surface by ions striking the surface, while general sputtering is achieved by ions striking on a sputter target. Methods for making ions strike a surface include applying high frequency voltage on the surface under an argon atmosphere and generating plasma in the vicinity of the substrate. Note that a nitrogen, helium, oxygen, or the like can be used instead of an argon atmosphere.

The etching of the oxide semiconductor layer can be either dry etching or wet etching. Naturally, the etching can alternatively be a combination of dry etching and wet etching. Etching conditions (such as etching gas, etchant, etching time, and temperature) are appropriately adjusted in accordance with the material in order for the material to be etched into desired shapes.

For example, a gas containing chlorine (a chlorine-based gas such as chlorine ($Cl_2$), triboron trichloride ($BCl_3$), tetrasilicon tetrachloride ($SiCl_4$), or tetracarbon tetrachloride ($CCl_4$)) is employed as an etching gas used for the dry etching. Alternatively, a gas containing fluorine (a fluorine-based gas such as carbon tetrafluoride ($CF_4$), sulfur hexafluoride ($SF_6$), nitrogen trifluoride ($NF_3$), or trifluoromethane ($CHF_3$)); hydrogen bromide (HBr); oxygen ($O_2$); any of these gases to which a rare gas such as helium (He) or argon (Ar) is added; or the like can be used.

Parallel plate RIE (reactive ion etching) or ICP (inductively coupled plasma) etching can be employed as the dry etching. In order for the films to be etched into desired shapes, the etching conditions (the amount of electric power applied to a coil-shaped electrode, the amount of electric power applied to an electrode on a substrate side, the temperature of the electrode on the substrate side, or the like) are adjusted as appropriate.

A mixed solution of phosphoric acid, acetic acid, and nitric acid; an ammonia peroxide mixture (hydrogen peroxide solution at 31 wt %:ammonia solution at 28 wt %:water=5:2:2); or the like can be used as an etchant used for wet etching. Alternatively, etchant such as ITO07N (by Kanto Chemical Co., Inc.) can be used.

Next, the oxide semiconductor layer 140 is preferably subjected to the first heat treatment. The first heat treatment allows the oxide semiconductor layer 140 to be dehydrated or dehydrogenated. The temperature of the first heat treatment is between 300 and 750° C., and is preferably 400° C. or more and less than the strain point of the substrate. For example, a substrate is introduced into an electric furnace using a resistance heating element or the like, and the oxide semiconductor layer 140 is subjected to heat treatment at 450° C. for an hour under a nitrogen atmosphere. During the treatment, the oxide semiconductor layer 140 is not exposed to air to prevent contamination by water or hydrogen present in the air.

The heat treatment apparatus is not limited to an electric furnace; the heat treatment apparatus can be an apparatus that heats an object using thermal conduction or thermal radiation given by a medium such as a heated gas or the like. For example, an RTA (rapid thermal annealing) apparatus such as a GRTA (gas rapid thermal annealing) apparatus or an LRTA (lamp rapid thermal annealing) apparatus is applicable. An LRTA apparatus is an apparatus that heats an object with radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus that performs heat treatment using a high-temperature gas. An inert gas which does not react with an object even during the heat treatment, such as nitrogen or a rare gas such as argon is used.

For example, the first heat treatment can employ GRTA, in which the substrate is moved into an inert gas heated at a high temperature of 650 to 700° C., and heated for several minutes there, and then the substrate is moved out of the inert gas. GRTA enables short-time high-temperature heat treatment. Further, such a short-time heat treatment is applicable even at a temperature exceeding the strain point of the substrate.

Note that in the first heat treatment is preferably used an atmosphere which contains nitrogen or a rare gas (helium, neon, argon, or the like) as its main component and which does not contain water, hydrogen, or the like. For example, the purity of nitrogen or a rare gas such as helium, neon, or argon, which is introduced into the heat treatment apparatus, is 6N (99.9999%) or more, and preferably 7N (99.99999%) or more (i.e. the impurity concentration is 1 ppm or less, and preferably 0.1 ppm or less).

The oxide semiconductor layer crystallizes to be microcrystalline or polycrystalline depending on the conditions of the first heat treatment and the composition of the oxide semiconductor layer. For example, the oxide semiconductor layer crystallizes to be a microcrystalline semiconductor layer with a degree of crystallization of 90% or more, or 80% or more in some cases. Further, the oxide semiconductor layer becomes an amorphous oxide semiconductor layer containing no crystalline component depending on the conditions of the first heat treatment and the composition of the oxide semiconductor layer.

In some cases, the oxide semiconductor layer becomes an oxide semiconductor layer in which a microcrystalline portion (with a grain diameter of 1 to 20 nm, typically 2 to 4 nm) is mixed into an amorphous oxide semiconductor (e.g. a surface of the oxide semiconductor layer).

It is possible to change the electrical characteristics of the oxide semiconductor layer by aligning microcrystals in the amorphous portion of the oxide semiconductor layer. For example, in the case where the oxide semiconductor layer is formed using an In—Ga—Zn—O based oxide semiconductor target, the electric characteristics of the oxide semiconductor layer can be changed by forming, in the oxide semiconductor layer, a microcrystalline portion where crystal grains of $In_2Ga_2ZnO_7$ having electrical anisotropy are aligned.

Specifically, for example by aligning the crystal grains of $In_2Ga_2ZnO_7$ so that their C-axis may be perpendicular to the surface of the oxide semiconductor layer, the oxide semiconductor layer exhibits an enhanced electrical conductivity in a direction parallel to the surface and an enhanced electrical resistivity in a direction perpendicular to the surface. Further, such a microcrystalline portion has the function of preventing impurities such as water and hydrogen from entering the oxide semiconductor layer.

The above oxide semiconductor layer having a microcrystalline portion can be obtained by heating a surface of the oxide semiconductor layer by GRTA. The use of a sputter target that contains more In or Ga than Zn allows the above oxide semiconductor layer to be formed in a preferable way.

The first heat treatment performed on the oxide semiconductor layer 140 can be performed on the oxide semiconductor layer not yet been processed into the island-shaped oxide semiconductor layer 140. In this case, the substrate is taken out from the heat treatment apparatus after the first heat treatment and then subjected to the photolithography process.

The above heat treatment can also be called a dehydration process or dehydrogenation process because it is effective in dehydrating or dehydrogenating the oxide semiconductor layer 140. It is possible to perform such a dehydration process or dehydrogenation process after forming the oxide semiconductor layer, after forming the second source electrode or the second drain electrode over the oxide semiconductor layer 140, or after forming a protective insulating layer over the second source electrode or the second drain electrode. Such a dehydration process or dehydrogenation process can be conducted more than once.

Figure 9F:
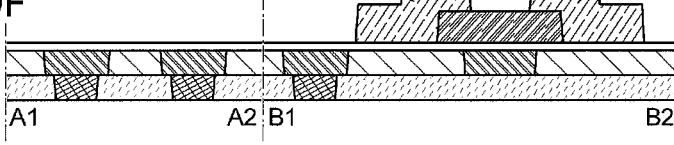

The electrode 142a and the electrode 142b are formed so as to be in contact with the oxide semiconductor layer 140 (see FIG. 9F). The electrode 142a and the electrode 142b are formed by forming a conductive layer so that the conductive layer covers the oxide semiconductor layer 140 and then selectively etching the conductive layer.

The conductive layer can be formed by PVD such as sputtering or CVD such as plasma CVD. Examples of the material for the conductive layer include an element selected from aluminum, chromium, copper, tantalum, titanium, molybdenum, and tungsten; and an alloy including any of these elements as a component. One or more of materials selected from manganese, magnesium, zirconium, beryllium, and thorium can be alternatively used for the conductive layer. Alternatively, aluminum combined with one or more of elements selected from titanium, tantalum, tungsten, molybdenum, chromium, neodymium, and scandium can be used for the conductive layer. The conductive layer can have either a single-layer structure or a layered structure of two or more layers. A single-layer structure of an aluminum film containing silicon, a two-layer structure in which a titanium film is stacked over an aluminum film, a three-layer structure in which a first titanium film, an aluminum film, and a second titanium film are stacked in this order, and the like can be given as examples.

Here, ultraviolet light, a KrF laser beam, or an ArF laser beam is preferably used for exposures for making an etching mask.

The channel length (L) of the transistor is determined by the distance between the lower part of the electrode 142a and the lower part of the electrode 142b. In the case where the channel length (L) is less than 25 nm, exposures for making a mask are performed in the extreme ultraviolet range of extremely short wavelength of several nanometers to several tens of nanometers. Exposures in the extreme ultraviolet range yield high resolution and a great depth of focus. Therefore, the channel length (L) of a transistor, which is formed later, can be 10 to 1000 nm, and thus the operation rate of the circuit can be increased. Further, since the off-state current is extremely low, the power consumption is not increased.

Each material and the etching conditions are adjusted as appropriate in order that the oxide semiconductor layer 140 may not be removed in the etching of the conductive layer. In this step, the oxide semiconductor layer 140 may be partly etched to be an oxide semiconductor layer having a groove (a depressed portion) depending on the composition of the oxide semiconductor layer and the etching conditions.

An oxide conductive layer can be formed between the oxide semiconductor layer 140 and the electrode 142a (one of the second source electrode and the second drain electrode) or between the oxide semiconductor layer 140 and the electrode 142b (the other one of the second source electrode and the second drain electrode). It is possible to successively form the oxide conductive layer and a metal layer which is to be the electrode 142a or the electrode 142b (successive deposition). The oxide conductive layer can function as a source region or a drain region. Such an oxide conductive layer leads to the reduction in the resistance of the source region or a drain region, and thus high-speed operation of the transistor is achieved.

Note that plasma treatment using a gas such as $N_2O$, $N_2$, and Ar is preferably conducted. The plasma treatment removes water or the like that adheres to an exposed surface of the oxide semiconductor layer. The plasma treatment can use a mixed gas of oxygen and argon.

Figure 9G:
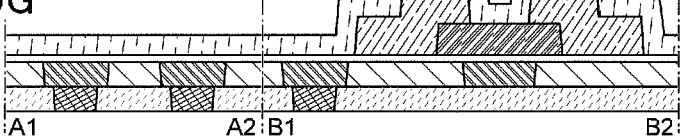

Next, a protective insulating layer 144 which is in contact with part of the oxide semiconductor layer 140 is formed without exposure to air during the formation steps (see FIG. 9G).

The protective insulating layer 144 is formed using as appropriate a method, such as sputtering, by which an impurity such as water or hydrogen is prevented from entering the protective insulating layer 144. The thickness of the protective insulating layer 144 is 1 nm or more. Examples of the material for the protective insulating layer 144 include silicon oxide, silicon nitride, silicon oxynitride, and silicon nitride oxide. The structure of the protective insulating layer 144 can be either a single-layer structure or a layered structure. The substrate temperature for the deposition of the protective insulating layer 144 is preferably room temperature or more and 300° C. or less. The atmosphere for the deposition of the protective insulating layer 144 is preferably a rare gas (typically argon) atmosphere, an oxygen atmosphere, or a mixed atmosphere of a rare gas (typically argon) and oxygen.

The mixing of hydrogen into the protective insulating layer 144 causes contamination of the oxide semiconductor layer by hydrogen, the stripping of oxygen from the oxide semiconductor layer due to hydrogen, or the like, whereby the resistance of the backchannel of the oxide semiconductor layer may be reduced and a parasitic channel may be formed. Therefore, it is important not to use hydrogen when forming the protective insulating layer 144 in order to minimize entry of hydrogen in the protective insulating layer 144.

It is preferable to form the protective insulating layer 144 while removing moisture remaining in the treatment chamber. This is in order to prevent hydrogen, hydroxyl, or water from entering the oxide semiconductor layer 140 and the protective insulating layer 144.

In order to remove moisture remaining in the treatment chamber, a sorption vacuum pump is used. For example, a cryopump, an ion pump, or a titanium sublimation pump is preferably used. The evacuation unit can be a turbo pump provided with a cold trap. A hydrogen atom, a compound containing a hydrogen atom, such as water ($H_2O$), and the like are removed from the deposition chamber when evacuated with the cryopump, thereby reducing the impurity concentration in the protective insulating layer 144 formed in the deposition chamber.

A sputtering gas for the deposition of the protective insulating layer 144 is preferably a high-purity gas in which the concentration of impurities such as hydrogen, water, hydroxyl, and hydride is so reduced that it is approximately in parts per million (preferably approximately in parts per billion).

Next, a second heat treatment is performed, preferably in an inert gas atmosphere or oxygen gas atmosphere (preferably at 200 to 400° C., e.g. 250 to 350° C.). For example, the second heat treatment is performed in a nitrogen atmosphere at 250° C. for one hour. The second heat treatment can reduce variations between transistors in electric characteristics.

Heat treatment can be performed at 100 to 200° C. for 1 to 30 hours in an air atmosphere. This heat treatment can be performed at a fixed heating temperature or follow temperature cycles where the temperature repeatedly rises from room temperature to a heating temperature of 100 to 200° C. and drops from the a heating temperature to room temperature. This heat treatment can be performed before the deposition of the protective insulating layer under a reduced pressure. Heat treatment under reduced pressure shortens the heating time. Note that this heat treatment can be performed instead of the second heat treatment, before the second heat treatment, after the second heat treatment, or the like.

Figure 10A:
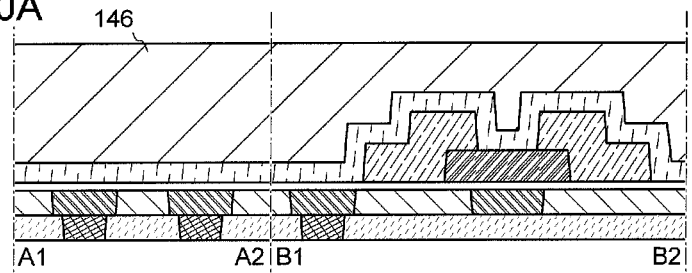
FIGS. 10A to 10D are diagrams illustrating the method for fabricating a nonvolatile memory.
Figure 10B:
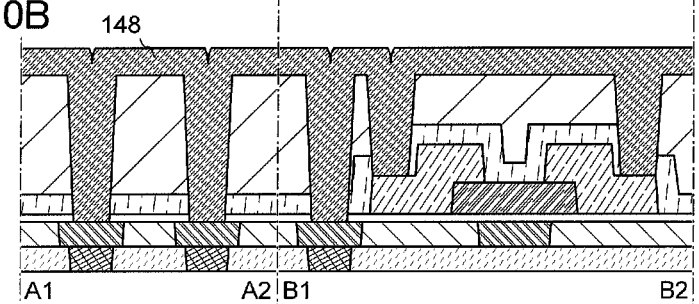

Next, an interlayer insulating layer 146 is formed over the protective insulating layer 144 (see FIG. 10A). The interlayer insulating layer 146 can be formed by PVD, CVD, or the like. The interlayer insulating layer 146 is formed using a material containing an inorganic insulating material, such as silicon oxide, silicon nitride oxide, silicon nitride, hafnium oxide, aluminum oxide, and tantalum oxide. After the interlayer insulating layer 146 is formed, a surface thereof is preferably flattened by CMP, etching, or the like.

Next, openings reaching the electrode 136a, the electrode 136b, the electrode 136c, the electrode 142a, and the electrode 142b are formed in the interlayer insulating layer 146, the protective insulating layer 144, and the second gate insulating layer 138. Then, a conductive layer 148 is formed so as to be embedded in the openings (see FIG. 10B). The openings are formed by etching using a mask. The mask is made by exposures using a photomask, for example. Either wet etching or dry etching can be used as the etching; in case of a fine patterning, dry etching is preferably used. The conductive layer 148 is formed by a deposition method such as PVD and CVD. Examples of the material for the conductive layer 134 include a conductive material such as molybdenum, titanium, chromium, tantalum, tungsten, aluminum, copper, neodymium, and scandium; and an alloy and compound (e.g. nitride) of any of these materials.

The method can employ a thin titanium film formed by PVD in a region including openings, a thin titanium nitride film formed by CVD, and a tungsten film formed so as to fill the openings. The titanium film formed by PVD reduces an oxide film interposed between the titanium film and a lower electrode (here, the electrode 136a, the electrode 136b, the electrode 136c, the electrode 142a, or the electrode 142b), and thereby reducing contact resistance between the titanium film and the lower electrode. The titanium nitride film to be formed afterwards a barrier function of blocking the diffusion of the conductive material. In addition, after a barrier film made of titanium or titanium nitride is formed, a copper film can be formed by plating.

Figure 10C:
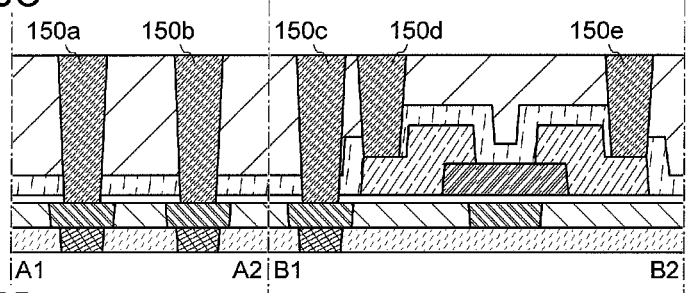
Figure 10D:
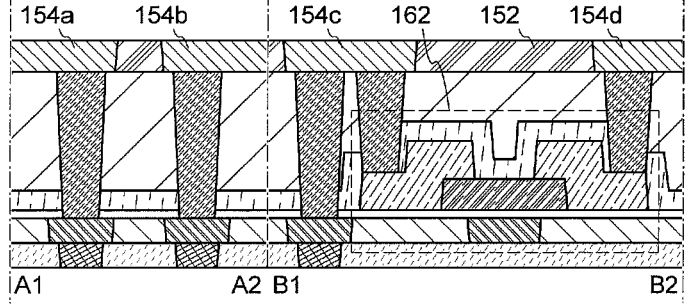

After the conductive layer 148 is formed, part of the conductive layer 148 is removed by etching or CMP, and the interlayer insulating layer 146 is thus exposed, thereby forming the electrode 150a, the electrode 150b, the electrode 150c, the electrode 150d, and the electrode 150e (see FIG. 10C). When the electrode 150a, the electrode 150b, the electrode 150c, the electrode 150d, and the electrode 150e are formed by removing part of the conductive layer 148, it is preferable that a surface be processed to be flat. Adequate electrodes, wirings, insulating layers, semiconductor layers, or the like can be formed in the later steps by such an improvement in the flatness of a surface of the interlayer insulating layer 146, the electrode 150a, the electrode 150b, the electrode 150c, the electrode 150d, and the electrode 150e.

An insulating layer 152 is formed, and openings reaching the electrode 150a, the electrode 150b, the electrode 150c, the electrode 150d, and the electrode 150e are formed in the insulating layer 152. Then, a conductive layer is formed so as to fill the openings. After that, part of the conductive layer is removed by etching or CMP, and the insulating layer 152 is thus exposed, thereby forming an electrode 154a, an electrode 154b, an electrode 154c, and an electrode 154d (see FIG. 10D). This process is similar to that of forming the electrode 150a and the like previously described, and the details are therefore omitted.

When the second transistor 21 is formed in the above manner, the hydrogen concentration in the oxide semiconductor layer 140 is $5\times10^{18}$ atoms/cm$^3$ or less. Further, even when the channel width (W) and the channel length (L) of the second transistor 21 are $1\times10^4$ µm and 3 µm, respectively, the off-state current and the subthreshold swing (S value) of the second transistor 21 is $10^{-13}$ A or less and 0.1 V/dec (the thickness of the second gate insulating layer 138: 100 nm), respectively. The use of such an oxide semiconductor layer 140 with high purity produced by an adequate reduction in hydrogen concentration produces the second transistor 21 having excellent characteristics and also produces a memory cell having excellent characteristics which has, in its lower part, the first transistor 20 using a material other than an oxide semiconductor and, in its upper part, the second transistor 21 using an oxide semiconductor.

The memory cells having the second transistor 21 the structure of which is different from that of the memory cell previously described will be described as variations (see FIG. 11 and FIGS. 12A and 12B). The structure of the first transistor 20 is similar to that of the memory cell previously described.

Figure 11:
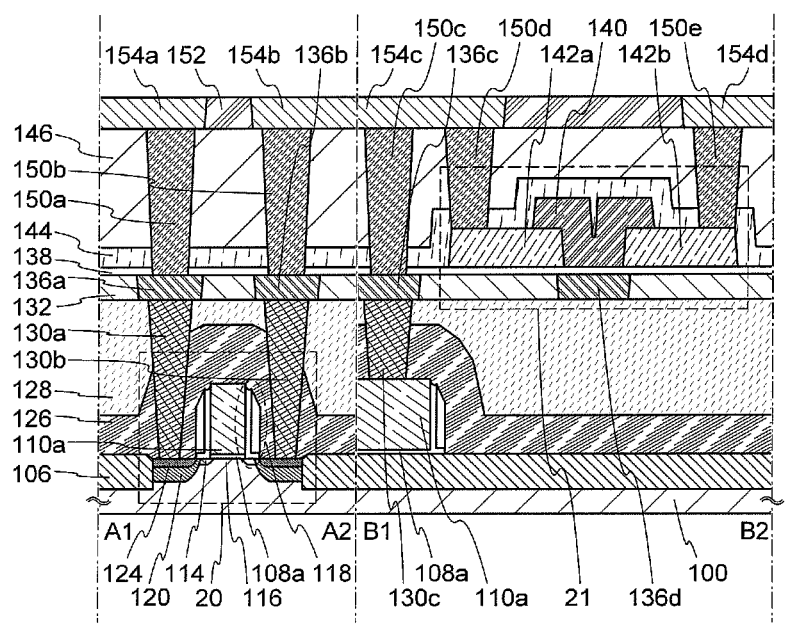
FIG. 11 is the cross-sectional view of a nonvolatile memory.

FIG. 11 shows an example of a memory cell including the second transistor 21 in which the second gate electrode 136d is below the oxide semiconductor layer 140 and the electrode 142a (one of the second source electrode and the second drain electrode) and the electrode 142b (the other one of the second source electrode and the second drain electrode) are in contact with the lower end of the oxide semiconductor layer 140. Note that the plane structure can be changed according to the sectional structure, and hence here, only the sectional structure is shown.

Figure 7B:
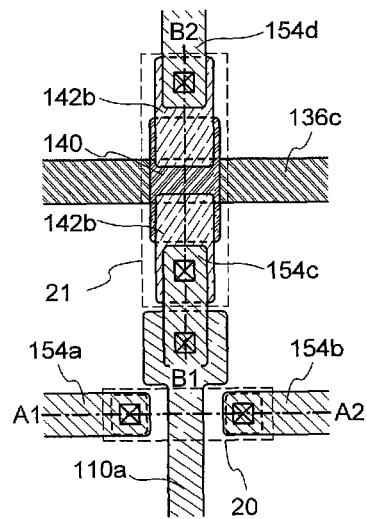

The memory cell shown in FIG. 11 and the memory cell shown in FIGS. 7A and 7B are largely different in the position where the electrode 142a or the electrode 142b is in contact with the oxide semiconductor layer 140. In other words, in the memory cell shown in FIGS. 7A and 7B, the electrode 142a or the electrode 142b is in contact with the upper end of the oxide semiconductor layer 140, while in the memory cell shown in FIG. 11, the electrode 142a or the electrode 142b is in contact with the lower end of the oxide semiconductor layer 140. The position of other electrodes, insulating layers, and the like also differs because of such a difference in the contact position. The details of each element are similar to those in FIGS. 7A and 7B.

Specifically, the memory cell shown in FIG. 11 includes the second gate electrode 136d over the interlayer insulating layer 128, the second gate insulating layer 138 over the second gate electrode 136d, the electrode 142a and the electrode 1426 over the second gate insulating layer 138, and the oxide semiconductor layer 140 being in contact with the upper end of the electrode 142a and electrode 142b.

Here, the second gate electrode 136d is formed so as to be embedded in an insulating layer 132 which is over the interlayer insulating layer 128. Further, as in the case of the second gate electrode 136d, an electrode 136a is formed so as to be in contact with the electrode 130a, an electrode 136b is formed so as to be in contact with the electrode 130b, and an electrode 136c is formed so as to be in contact with the electrode 130c.

A protective insulating layer 144 is formed over the second transistor 21 so as to be in contact with part of the oxide semiconductor layer 140. An interlayer insulating layer 146 is formed over the protective insulating layer 144. Here, openings reaching the electrode 142a and the electrode 1426 are provided in the protective insulating layer 144 and the interlayer insulating layer 146. An electrode 150d and an electrode 150e are formed so as to be in contact with the electrode 142a and the electrode 142b through the openings. As in the case of the electrode 150d and the electrode 150e, an electrode 150a, an electrode 150b, and an electrode 150c are formed so as to be in contact with the electrode 136a, the electrode 136b, and the electrode 136c respectively, through openings in the second gate insulating layer 138, the protective insulating layer 144, and the interlayer insulating layer 146.

An insulating layer 152 is formed over the interlayer insulating layer 146. An electrode 154a, an electrode 154b, an electrode 154c, and an electrode 154d are formed so as to be embedded in the insulating layer 152. Here, the electrode 154a is in contact with the electrode 150a, the electrode 154b is in contact with the electrode 1506, the electrode 154c is in contact with the electrodes 150c and 150d, and the electrode 154d is in contact with the electrode 150e.

Figure 12A:
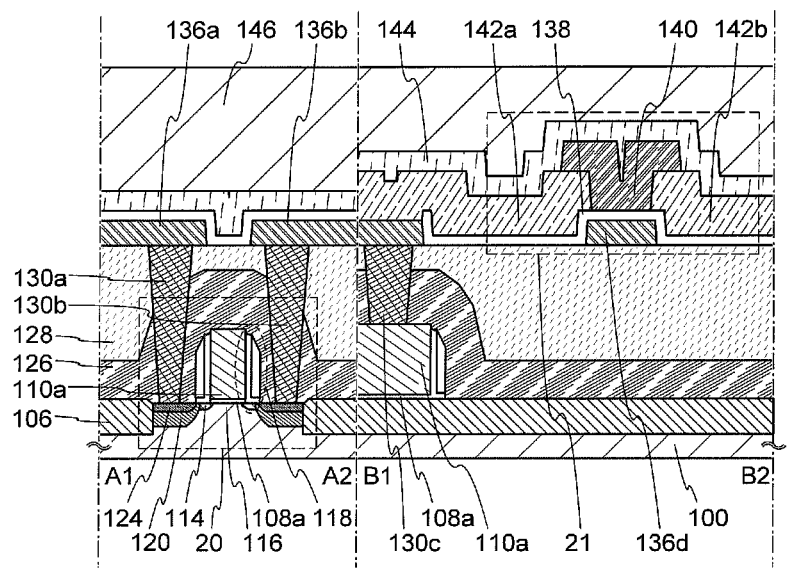
FIGS. 12A and 12B are the cross-sectional views of nonvolatile memories.
Figure 12B:
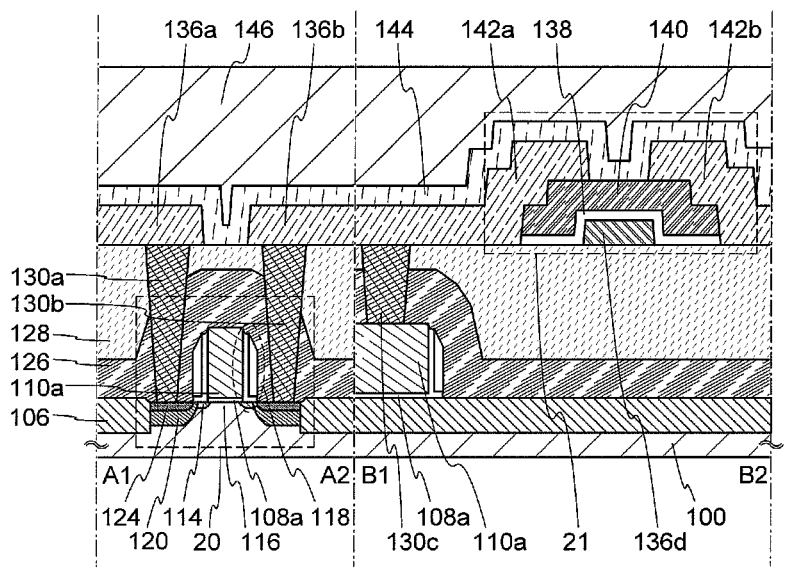

FIGS. 12A and 12B each illustrate an example of the memory cell having elements in relatively large size and including the gate electrode 136d below the oxide semiconductor layer 140. In this case, a requirement for the flatness of a surface is relatively small, and it is hence not necessary for wiring, an electrode, and the like to be embedded in an insulating layer. For example, the second gate electrode 136d and the like can be formed by forming a conductive layer and processing the formed conductive layer.

The memory cell shown in FIG. 12A is largely different from the memory cell shown in FIG. 12B in having the electrode 142a and the electrode 142b are in contact with the lower end of the oxide semiconductor layer 140, while the memory cell shown in FIG. 12B has the electrode 142a and the electrode 142b being in contact with the upper end of the oxide semiconductor layer 140. The position of other electrodes, insulating layers, and the like also differs because of such a difference in the contact position. The details of each element are similar to those in FIGS. 7A and 7B and the like.

Specifically, the memory cell shown in FIG. 12A includes the second gate electrode 136d over the interlayer insulating layer 128, the second gate insulating layer 138 over the second gate electrode 136d, the electrode 142a and the electrode 142b over the second gate insulating layer 138, and the oxide semiconductor layer 140 being in contact with the upper end of the electrode 142a and electrode 1426.

The memory cell shown in FIG. 12B includes the second gate electrode 136d over the interlayer insulating layer 128, the second gate insulating layer 138 over the second gate electrode 136d, the oxide semiconductor layer 140 being over the second gate insulating layer 138 and overlapping with the second gate electrode 136d, and the electrode 142a and the electrode 142b which are in contact with the upper end of the oxide semiconductor layer 140.

Also in FIGS. 12A and 12B, an element in FIGS. 7A and 7B is omitted in some cases. This also simplifies the fabrication process.

As described above, the energy gap of the oxide semiconductor is 2 eV or more. It can therefore be said that the oxide semiconductor is a wide bandgap semiconductor. The well-known wide bandgap semiconductors are SiC and the like. It is possible to fabricate the oxide semiconductor at a low temperature, compared to SiC and the like. Applying SiC to the second transistor requires high temperature processing. The high temperature processing causes heat damage to the first transistor. This embodiment, however, employs an oxide semiconductor and thus causes definitely less damage to the first transistor than SiC and the like.

The methods and structures described in this embodiment can be combined as appropriate with any of those described in the other embodiments.

Embodiment 2

This embodiment shows a nonvolatile memory including a first memory cell, and a second memory cell. The first memory cell includes a first transistor, a second transistor, and a first capacitor. The first transistor includes a first channel, a first gate electrode, a first source electrode, and a first drain electrode. The second transistor includes a second channel, a second gate electrode, a second source electrode, and a second drain electrode. The second channel is formed in an oxide semiconductor. One of the second source electrode and the second drain electrode is electrically connected to the first gate electrode and one electrode of the first capacitor. The second memory cell includes a third transistor, a fourth transistor, and a second capacitor. The third transistor includes a third channel, a third gate electrode, a third source electrode, and a third drain electrode. The fourth transistor includes a fourth channel, a fourth gate electrode, a fourth source electrode, and a fourth drain electrode. The fourth channel is formed in an oxide semiconductor. One of the fourth source electrode and the fourth drain electrode is electrically connected to the third gate electrode and one electrode of the second capacitor. One of the first source electrode and the first drain electrode is the one of the third source electrode and the third drain electrode, or the one of the first source electrode and the first drain electrode is electrically connected to the one of the third source electrode and the third drain electrode. Data writing in the first memory cell is done by raising the potential of a node between one of the second source electrode and the second drain electrode, and the first gate electrode and a potential of the one electrode of the first capacitor, or by storing charge in the node and the one electrode of the first capacitor. Data erasure in the first memory cell is done by irradiating the second channel with ultraviolet light and lowering the potential of the node and the potential of the one electrode of the first capacitor, or by releasing charge from the node and the one electrode of the first capacitor. Data writing in the second memory cell is done by raising a potential of a node between one of the fourth source electrode and the fourth drain electrode, and the third gate electrode and a potential of the one electrode of the second capacitor, or by storing charge in the node and the one electrode of the second capacitor. Data erasure in the second memory cell is done by irradiating the fourth channel with ultraviolet light and lowering the potential of the node and the potential of the one electrode of the second capacitor, or by releasing charge from the node and the one electrode of the second capacitor.

Figure 13:
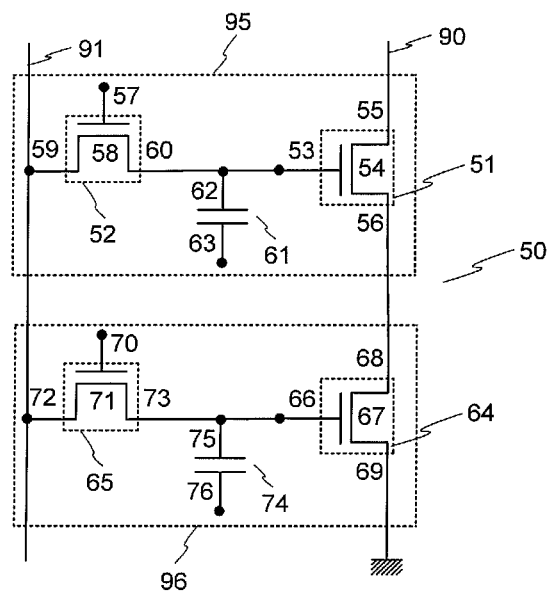
FIG. 13 is a diagram illustrating the circuit of a nonvolatile memory.

A nonvolatile memory 50 includes a first memory cell 95 and a second memory cell 96 (see FIG. 13).

The first memory cell 95 includes a first transistor 51, a second transistor 52, and a first capacitor 61. The first transistor 51 includes a first channel 54, a first gate electrode 53, an electrode 56 (one of the first source electrode and the first drain electrode), and an electrode 55 (the other one of the first source electrode and the first drain electrode). Needless to say, the first transistor 51 includes a first gate insulating film. The second transistor 52 includes a second channel 58, a second gate electrode 57, an electrode 60 (one of the second source electrode and the second drain electrode), and an electrode 59 (the other one of the second source electrode and the second drain electrode). Needless to say, the second transistor 52 includes a second gate insulating film. The first capacitor 61 includes one electrode 62, the other electrode 63, and an insulating film between the electrode 62 and the electrode 63.

The electrode 55 is electrically connected to a data output line 90. The electrode 60 is electrically connected to the first gate electrode 53 and the electrode 62. The electrode 59 is electrically connected to a data input and output line 91 and a data signal is hence input and output to/from the electrode 59.

A selection signal by which the second transistor 52 is turned on is input to the second gate electrode 57. The electrode 63 can be grounded.

The second memory cell 96 includes a third transistor 64, a fourth transistor 65, and a second capacitor 74. The third transistor 64 includes a third channel 67, a third gate electrode 66, an electrode 68 (one of the third source electrode and the third drain electrode), and an electrode 69 (the other one of the third source electrode and the third drain electrode). Needless to say, the third transistor 64 includes a third gate insulating film. The fourth transistor 65 includes a fourth channel 71, a fourth gate electrode 70, an electrode 73 (one of the fourth source electrode and the fourth drain electrode), and an electrode 72 (the other one of the fourth source electrode and the fourth drain electrode). Needless to say, the fourth transistor 65 includes a fourth gate insulating film. The second capacitor 74 includes one electrode 75, the other electrode 76, and an insulating film between the electrode 75 and the electrode 76.

The electrode 68 is electrically connected to the electrode 56. The electrode 69 is grounded. The electrode 73 is electrically connected to the third gate electrode 66 and the electrode 75. The electrode 72 is electrically connected to the data input and output line 91 and a data signal is hence input to the electrode 72. A selection signal by which the fourth transistor 65 is turned on is input to the fourth gate electrode 70. The electrode 76 can be grounded.

The material for the second channel 58 and the fourth channel 71 includes an oxide semiconductor. The first channel 54 and the third channel 67 are formed using a material other than an oxide semiconductor, e.g. one selected from silicon, germanium, silicon-germanium, silicon-carbon, and gallium arsenide. The first transistor 51 and the third transistor 64 using a material other than an oxide semiconductor are capable of adequately high-speed operation, and thus enable high-speed data reading or the like. The second transistor 52 and the fourth transistor 65 using an oxide semiconductor are characterized by extremely low off-state current. Hence, when the second transistor 52 is off, the potential of the first gate electrode 53 of the first transistor 51 and the potential of the electrode 62 can be held for extremely long periods of time. In other words, even when no potential is applied to the second gate electrode 57 (the power is turned off), data remains held. Thus, a nonvolatile memory is achieved. When the fourth transistor 65 is off, the potential of the third gate electrode 66 of the third transistor 64 and the potential of the electrode 75 can be held for extremely long periods of time. In other words, even when no potential is applied to the fourth gate electrode 70 (the power is turned off), data remains held. Thus, a nonvolatile memory is achieved.

Since the potential of the first gate electrode 53, the potential of the electrode 62, the potential of the third gate electrode 66, and the potential of the electrode 75 can be held, data writing, data holding, and data reading are achieved. Further, data is easily be erased by ultraviolet irradiation.

(Method of Operation)

The operation of the nonvolatile memory 50 will be described.

1. Data Writing, Data Holding, and Data Reading

Figure 14A:
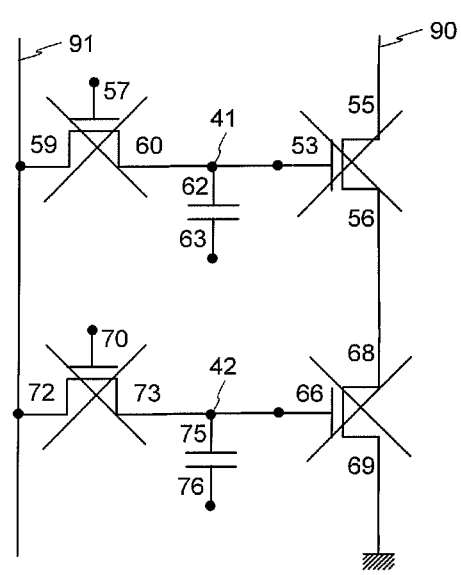
FIGS. 14A and 14B are diagrams illustrating the operation of a nonvolatile memory.

In an initial state, the first transistor 51, the second transistor 52, the third transistor 64, and the fourth transistor 65 are off (see FIG. 14A).

1. Data Writing, Data Holding, and Data Reading in the First Memory Cell 95

Voltage ($V_{G2}$) is applied to the second gate electrode 57, and the second transistor 52 is turned on. This holds for $V_{G2} \geq$ the threshold voltage of the second transistor 52 ($V_{TH2}$)

Figure 14B:
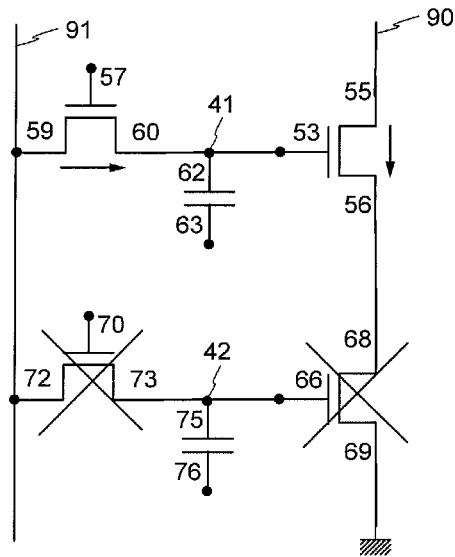

(the voltage $V_{G2}$ is higher than or equal to the voltage $V_{TH2}$). When the second transistor 52 is turned on, the potential of the data input output line 91 ($V_{SD2}$) is applied to the node 41 between the electrode 60 and the first gate electrode 53 and to the electrode 62. The potential of the node 41 and the electrode 62 is increased. Charge from the data input output line 91 is stored in the node 41 through the electrode 59 and the electrode 60. Charge is also stored in the first capacitor 61. Since the node 41, the electrode 62, and the first gate electrode 53 have the same potential, the first transistor 51 is turned on when $V_{SD2}$ is applied to the first gate electrode 53. This holds for $V_{SD2} \geq$ the threshold voltage of the first transistor 51 ($V_{TH1}$) (the voltage $V_{SD2}$ is higher than or equal to the voltage $V_{TH1}$). When the first transistor 51 is turned on, current flows from the electrode 55 to the electrode 56 (see FIG. 14B, data writing).

Figure 15:
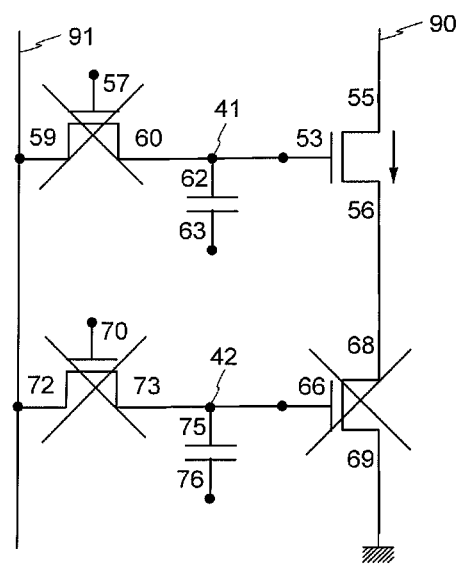
FIG. 15 is a diagram illustrating the operation of a nonvolatile memory.

In a next step, the potential at which the second transistor 52 is turned off, e.g. 0 V, is applied to the second gate electrode 57. This holds for $0 < V_{TH2}$. As stated above the second transistor 52 offers extremely low off-state current, so that the potential of the node 41 and the electrode 62 is not decreased but held. Charge stored in the node 41 and the first capacitor 61 is held. Since the node 41, the electrode 62, and the first gate electrode 53 have the same potential, the first transistor 51 remains on (see FIG. 15, data holding and data reading).

On the other hand, the fourth transistor 65 and the third transistor 64 remain off. The potential of the node 42 between the electrode 73 and the third gate electrode 66 is not increased but held. This is because the fourth transistor 65 offers extremely low off-state current.

2. Data Writing, Data Holding, and Data Reading in the Second Memory Cell 96

Figure 16A:
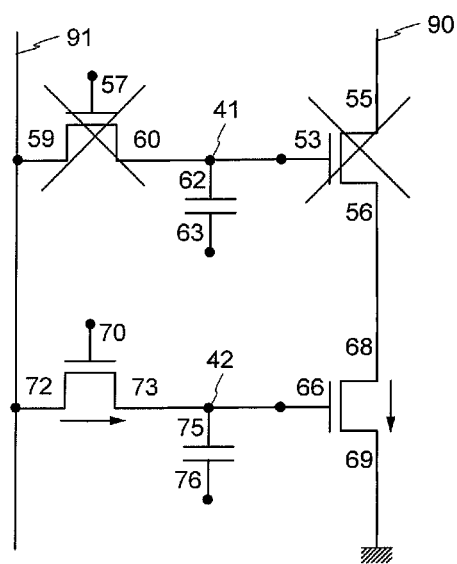
FIGS. 16A and 16B are diagrams illustrating the operation of a nonvolatile memory.

Voltage ($V_{G4}$) is applied to the fourth gate electrode 70, and the fourth transistor 65 is turned on. This holds for $V_{G4} \geq$ the threshold voltage of the fourth transistor 65 ($V_{TH4}$) (the voltage $V_{G4}$ is higher than or equal to the voltage $V_{TH4}$). When the fourth transistor 65 is turned on, the potential of the data input output line 91 ($V_{SD4}$) is applied to the node 42 and the electrode 75. The potential of the node 42 and the electrode 75 is increased. Charge from the data input output line 91 is stored in the node 42 through the electrode 72 and the electrode 73. Charge is also stored in the second capacitor 74. Since the node 42, the electrode 75, and the third gate electrode 66 have the same potential, the third transistor 64 is turned on when $V_{SD4}$ is applied to the third gate electrode 66. This holds for $V_{SD4} \geq$ the threshold voltage of the third transistor 64 ($V_{TH3}$) (the voltage $V_{SD4}$ is higher than or equal to the voltage Van). When the third transistor 64 is turned on, if the potential of the electrode 68 is higher than that of the electrode 69, current flows from the electrode 68 to the electrode 69 (see FIG. 16A, data writing).

Figure 16B:
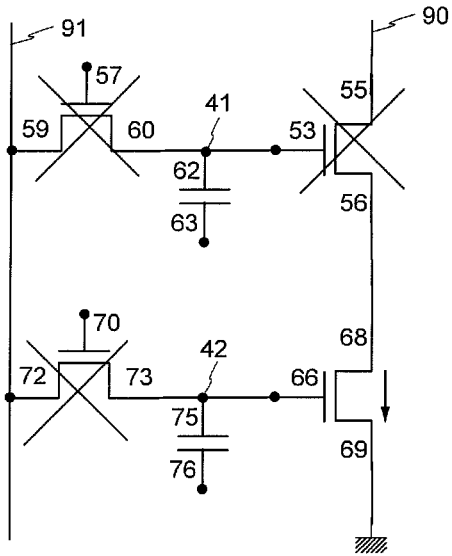

In a next step, the potential at which the fourth transistor 65 is turned off, e.g. 0 V, is applied to the fourth gate electrode 70. This holds for $0 < V_{TH4}$. As stated above the fourth transistor 65 offers extremely low off-state current, so that the potential of the node 42 and the electrode 75 is not decreased but held. Charge stored in the node 42 and the second capacitor 74 is held. Since the node 42, the electrode 75, and the third gate electrode 66 have the same potential, the third transistor 64 remains on (see FIG. 16B, data holding and data reading).

On the other hand, the first transistor 51 and the second transistor 52 remain off. Since the second transistor 52 offers extremely low off-state current, the potential of the node 41 is not increased but held.

3. Data Writing, Data Holding, and Data Reading in the First Memory Cell 95 and the Second Memory Cell 96

Voltage ($V_{G2}$) is applied to the second gate electrode 57, and the second transistor 52 is turned on. When the second transistor 52 is turned on, the potential of the data input output line 91 ($V_{SD2}$) is applied to the node 41 between the electrode 60 and the first gate electrode 53 and to the electrode 62. The potential of the node 41 is increased. Charge from the data input output line 91 is stored in the node 41 through the electrode 59 and the electrode 60. Charge is also stored in the first capacitor 61. The first transistor 51 is turned on when $V_{SD2}$ is applied to the first gate electrode 53.

Voltage ($V_{G4}$) is applied to the fourth gate electrode 70, and the fourth transistor 65 is turned on. When the fourth transistor 65 is turned on, the potential of the data input output line 91 ($V_{SD4}$=$V_{SD2}$) is applied to the node 42. The potential of the node 42 and the electrode 75 is increased. Charge from the data input output line 91 is stored in the node 42 through the electrode 72 and the electrode 73. Charge is also stored in the second capacitor 74. The third transistor 64 is turned on when $V_{SD4}$ is applied to the third gate electrode 66.

Figure 17A:
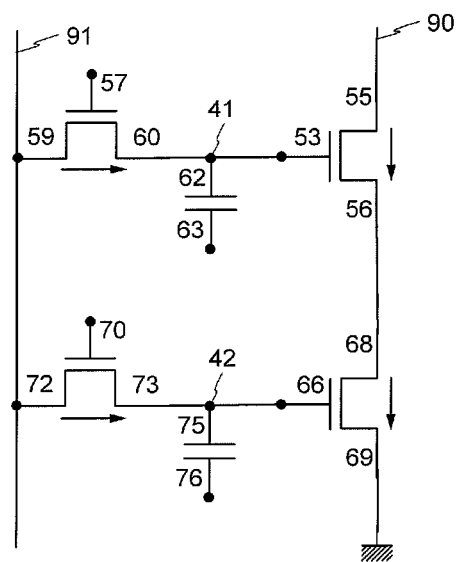
FIGS. 17A and 17B are diagrams illustrating the operation of a nonvolatile memory.

When the first transistor 51 and the third transistor 64 are turned on, current flows from the electrode 55 to the electrode 56, the electrode 68, and the electrode 69 (see FIG. 17A, data writing).

In a next step, the potential at which the second transistor 52 is turned off, e.g. 0 V, is applied to the second gate electrode 57. Further, the potential at which the fourth transistor 65 is turned off, e.g. 0 V, is applied to the fourth gate electrode 70. The potential of the node 41, the electrode 62, the node 42, and the electrode 75 is not decreased but held. Charge stored in the node 41 and the first capacitor 61 and charge stored in the node 42 and the second capacitor 74 are held. The first transistor 51 and the third transistor 64 remain on and current keeps flowing therethrough (see FIG. 17B, data holding and data reading).

2. Data Erasure

Figure 17B:
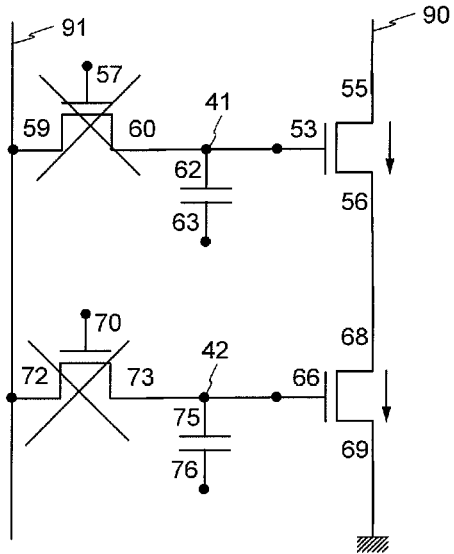
Figure 18A:
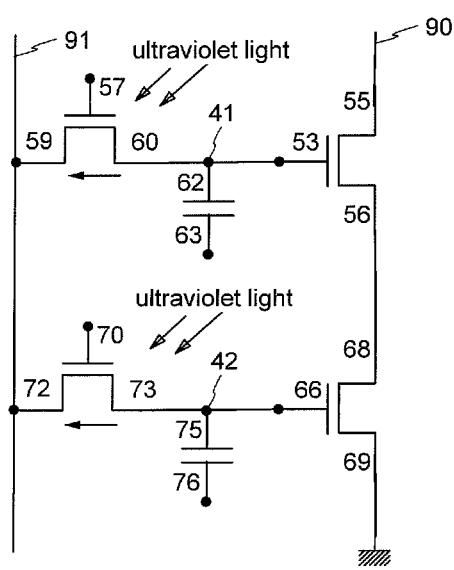
FIGS. 18A and 18B are diagrams illustrating the operation of a nonvolatile memory.

Here, data in the nonvolatile memory 50 being as shown in FIG. 17B is erased at once. The second channel 58 of the second transistor 52 and the fourth channel 71 of the fourth transistor 65 are irradiated with ultraviolet light. The second transistor 52 and the fourth transistor 65 become normally on, i.e. on, when irradiated with ultraviolet light (see FIG. 18A). The second transistor 52 and the fourth transistor 65 become on also when voltage of 0 V is applied to the second gate electrode 57 and the fourth gate electrode 70. The second transistor 52 and the fourth transistor 65 remain on even when ultraviolet irradiation is stopped.

Figure 18B:
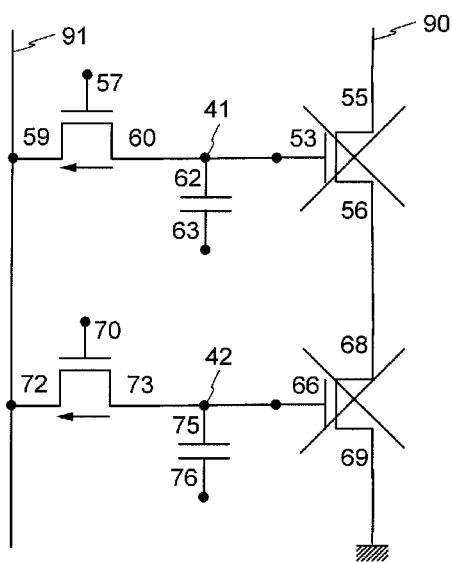
Figure 19:
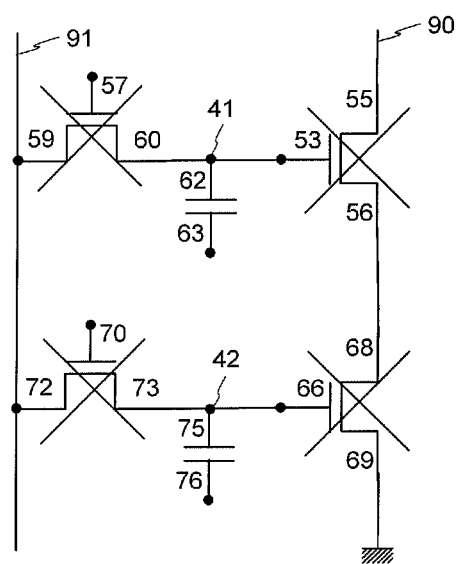
FIG. 19 is a diagram illustrating the operation of a nonvolatile memory.

At that time, the potential of the data input output line 91 is decreased to lower than the potential of the node 41 and node 42. Since the second transistor 52 and the fourth transistor 65 are on, the potential of the second node 41 and node 42 is decreased. Charge stored in the node 41 and the node 42 and charge stored in the first capacitor 61 and the second capacitor 74 are released. The first transistor 51 and the third transistor 64 are turned off (see FIG. 18B, data erasure). In a next step, the second transistor 52 and the fourth transistor 65 are left standing, so that the second transistor 52 and the fourth transistor 65 become normally off (see FIG. 19). As described above, even when voltage of 0 V is applied to the second gate electrode 57 and the fourth gate electrode 70, the data can be erased only by ultraviolet irradiation at once.

Ultraviolet light is the same as that shown in Embodiment 1.

The first transistor 51 and the third transistor 64 are formed using a similar structure and material to the first transistor 20 of Embodiment 1. The second transistor 52 and the fourth transistor 65 are formed using a similar structure and material to the second transistor 21 of Embodiment 1.

The first capacitor 61 can have the electrode 62 formed using a heavily doped region of the first transistor 51, for example; an insulating layer formed using the same layer as the first gate insulating layer; and the electrode 63 formed using the same layer as the first gate electrode 53. This is the same for the second capacitor 74.

The nonvolatile memory 50 of this embodiment can be fabricated in the manner shown in Embodiment 1.

Embodiment 3

This embodiment is a nonvolatile memory including a memory cell including a first transistor, a second transistor, and a third transistor. The first transistor includes a first channel, a first gate electrode, a first source electrode, and a first drain electrode. The second transistor includes a second channel, a second gate electrode, a second source electrode, and a second drain electrode. The second channel is formed in an oxide semiconductor. The third transistor includes a third channel, a third gate electrode, a third source electrode, and a third drain electrode. One of the second source electrode and the second drain electrode is electrically connected to the first gate electrode. One of the first source electrode and the first drain electrode is the one of the third source electrode and the third drain electrode, or the one of the first source electrode and the first drain electrode is electrically connected to the one of the third source electrode and the third drain electrode. Data writing in the memory cell is done by raising a potential of a node between one of the second source electrode and the second drain electrode and the first gate electrode, or by storing charge in the node. The data in the memory cell is erased by irradiating the second channel with ultraviolet light and lowering the potential of the node, or by releasing the charge from the node.

Figure 20:
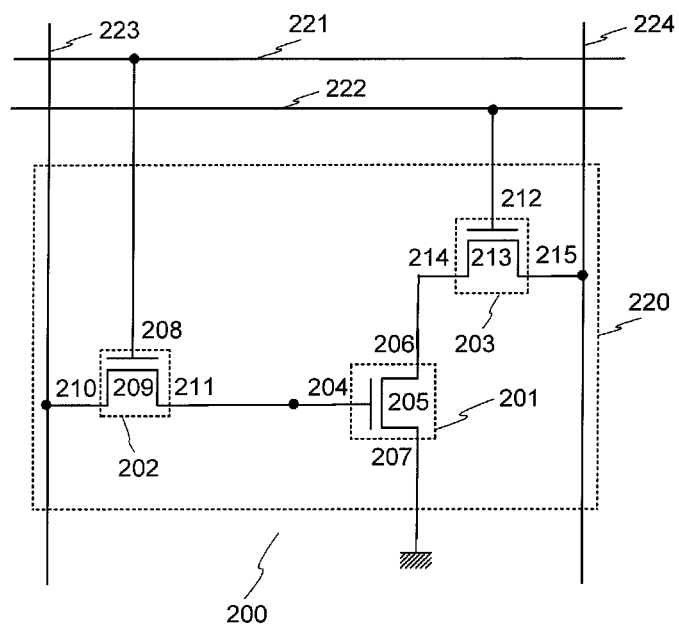
FIG. 20 is a diagram illustrating the circuit of a nonvolatile memory.

A nonvolatile memory 200 includes a memory cell 220 including a first transistor 201, a second transistor 202, and a third transistor 203 (see FIG. 20).

The first transistor 201 includes a first channel 205, a first gate electrode 204, an electrode 206 (one of the first source electrode and the first drain electrode), and an electrode 207 (the other one of the first source electrode and the first drain electrode). In addition, the first transistor 201 includes a first gate insulating film. The second transistor 202 includes a second channel 209, a second gate electrode 208, an electrode 211 (one of the second source electrode and the second drain electrode), and an electrode 210 (the other one of the second source electrode and the second drain electrode). In addition, the second transistor 202 includes a second gate insulating film. The third transistor 203 includes a third channel 213, a third gate electrode 212, an electrode 214 (one of the third source electrode and the third drain electrode), and an electrode 215 (the other one of the third source electrode and the third drain electrode). In addition, the third transistor 203 includes a third gate insulating film.

The electrode 207 can be grounded. The electrode 206 is electrically connected to the electrode 214. The second gate electrode 208 is electrically connected to a line 221 and a write signal by which the second transistor 202 is turned on is hence input to the second gate electrode 208. The electrode 211 is electrically connected to the first gate electrode 204. The electrode 210 is electrically connected to a data input output line 223, and a data signal is input to the electrode 210. The third gate electrode 212 is electrically connected to a line 222, and a read signal by which the third transistor 203 is turned on is input to the third gate electrode 212. The electrode 215 is electrically connected to a data output line 224.

The material for the second channel 209 includes an oxide semiconductor. The first channel 205 and the third channel 213 are formed using a material other than an oxide semiconductor, e.g. one selected from silicon, germanium, silicon-germanium, silicon-carbon, and gallium arsenide. The first transistor 201 and the third transistor 203 using a material other than oxide semiconductor material are capable of adequately high-speed operation, and thus enable high-speed data reading or the like. The second transistor 202 using an oxide semiconductor is characterized by extremely low off-state current. Hence, when the second transistor 202 is off, the potential of the first gate electrode 204 of the first transistor 201 can be held for extremely long periods of time. In other words, even when no potential is applied to the second gate electrode 208 (the power is turned off), data remains held. Thus, a nonvolatile memory is achieved.

Since the potential of the first gate electrode 204 can be held, data writing, data holding, and data reading are achieved. Further, data is easily be erased by ultraviolet irradiation.

(Method of Operation)

The operation of the nonvolatile memory 200 will be described.

1. Data Writing, Data Holding, and Data Reading

Figure 21A:
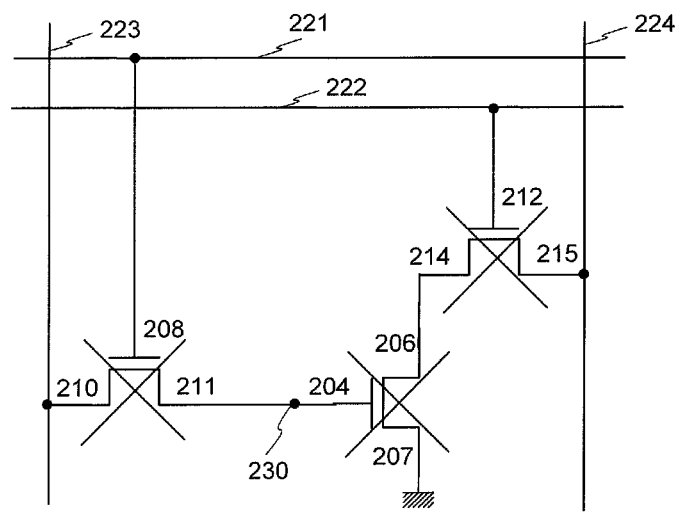
FIGS. 21A and 21B are diagrams illustrating the operation of a nonvolatile memory.

In an initial state, the first transistor 201, the second transistor 202, and the third transistor 203 are off (see FIG. 21A).

Figure 21B:
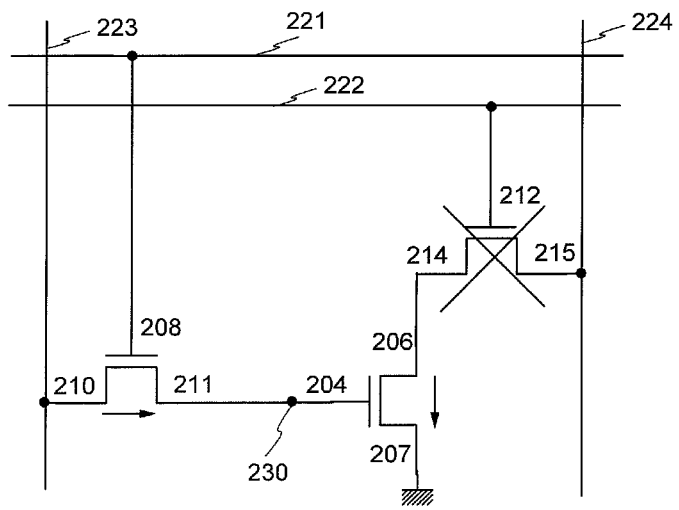

Voltage ($V_{G2}$) is applied to the line 221 and voltage ($V_{G2}$) is applied to the second gate electrode 208, and the second transistor 202 is turned on. This holds for $V_{G2} \geq$ the threshold voltage of the second transistor 202 ($V_{TH2}$) (the voltage $V_{G2}$ is higher than or equal to the voltage $V_{TH2}$). When the second transistor 202 is turned on, the potential of the data input output line 223 ($V_{SD2}$) is applied to the node 230 between the electrode 211 and the first gate electrode 204. The potential of the node 230 is increased. Charge from the data input output line 223 is stored in the node 230 through the electrode 210 and the electrode 211. Since the node 230 and the first gate electrode 204 have the same potential, the first transistor 201 is turned on when $V_{SD2}$ is applied to the first gate electrode 204. This holds for $V_{SD2} \geq$ the threshold voltage of the first transistor 201 ($V_{TH1}$) (the voltage $V_{SD2}$ is higher than or equal to the voltage $V_{TH1}$). When the first transistor 201 is turned on, if the potential of the electrode 206 is higher than that of the electrode 207, current flows from the electrode 206 to the electrode 207 (see FIG. 21B, data writing).

In a next step, the potential at which the second transistor 202 is turned off, e.g. 0 V, is applied to the second gate electrode 208. This holds for $0 < V_{TH2}$. As stated above the second transistor 202 offers extremely low off-state current, so that the potential of the node 230 is not decreased but held. Charge stored in the node 230 is held. Since the node 230 and the first gate electrode 204 have the same potential, the first transistor 201 remains on and current keeps flowing therethrough (see FIG. 22A, data holding). A capacitor may further be provided to the node 230 in order to hold charge, as in Embodiment 2.

To read held data, voltage ($V_{G3}$) is applied to the line 222 and voltage ($V_{G3}$) is applied to the third gate electrode 212, thereby turning on the third transistor 203. This holds for $V_{G3} \geq$ the threshold voltage of the third transistor 203 ($V_{TH3}$) (the voltage $V_{G3}$ is higher than or equal to the voltage $V_{TH3}$). Note that the first transistor 201 remains on. When the third transistor 203 is turned on, current flows from the data output line 224 to the electrode 215, the electrode 214, the electrode 206, and the electrode 207 (see FIG. 22B, data reading).

2. Data Erasure

Figure 22A:
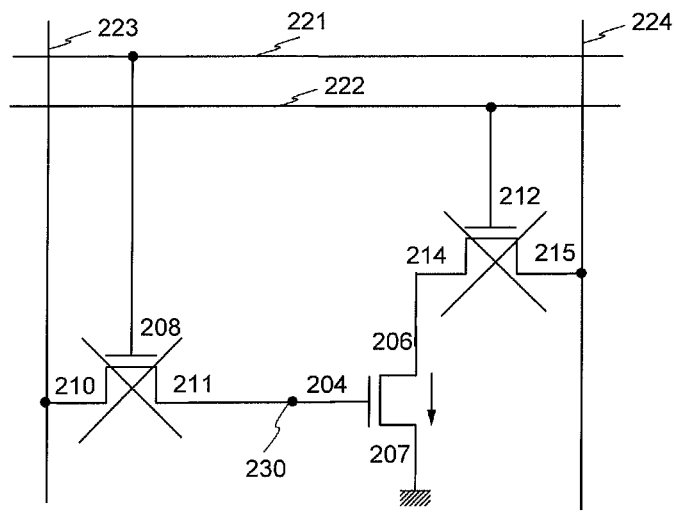
FIGS. 22A and 22B are diagrams illustrating the operation of nonvolatile memory.
Figure 22B:
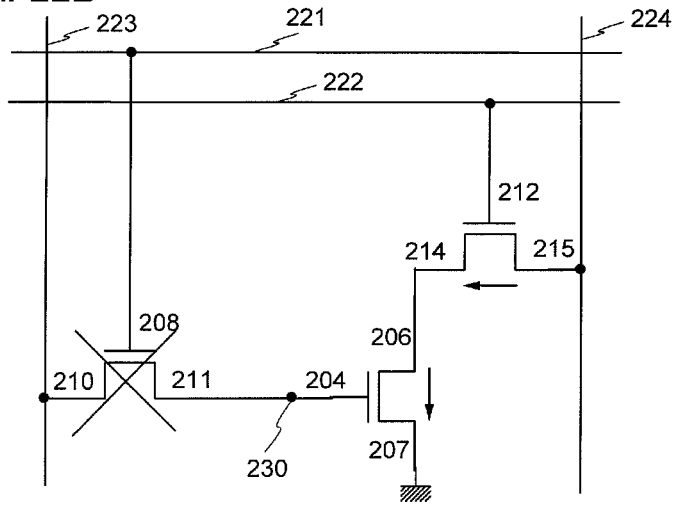
Figure 23A:
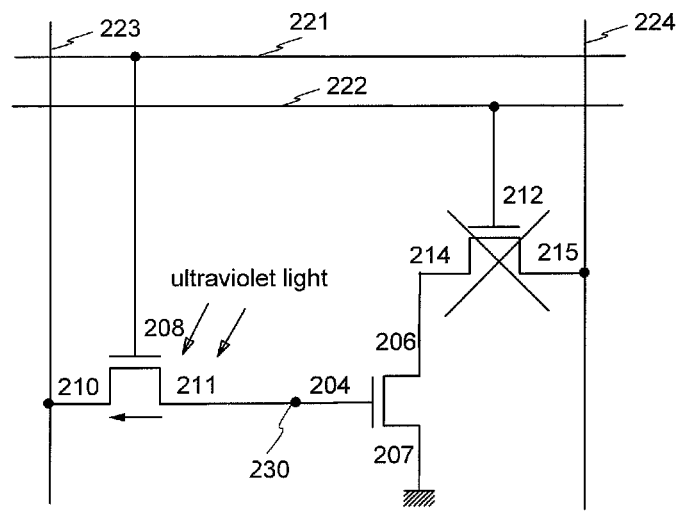
FIGS. 23A and 23B are diagrams illustrating the operation of a nonvolatile memory.

Here, data in the nonvolatile memory 200 being as shown in FIG. 22A is erased. The second channel 209 of the second transistor 202 is irradiated with ultraviolet light. The second transistor 202 becomes normally on, i.e. on, when irradiated with ultraviolet light (see FIG. 23A). The second transistor 202 becomes on even when voltage of 0 V is applied to the second gate electrode 208. The second transistor 202 remains on even when ultraviolet irradiation is stopped.

Figure 23B:
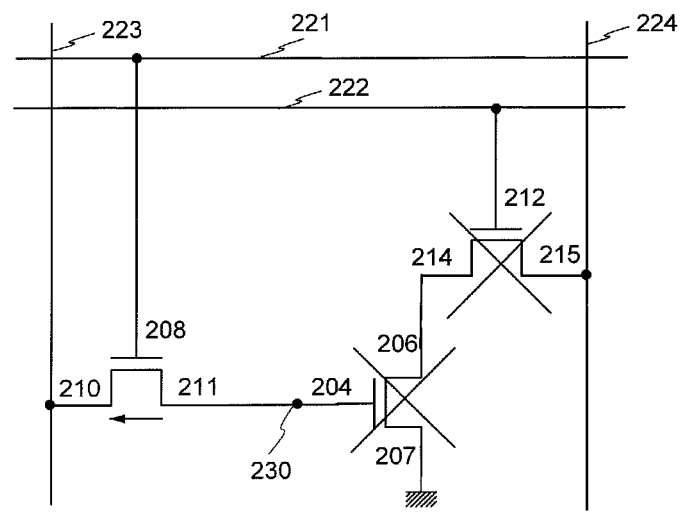
Figure 24:
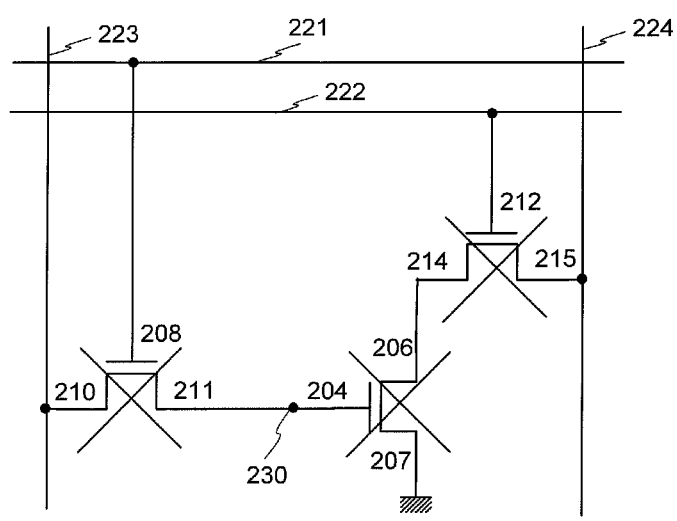
FIG. 24 is a diagram illustrating the operation of a nonvolatile memory.

At that time, the potential of the data input output line 223 is decreased to lower than the potential of the node 230. Since the second transistor 202 is on, the potential of the node 230 is decreased. Charge stored in the second node 230 is released. The first transistor 201 is turned off (see FIG. 23B, data erasure). In a next step, the second transistor 202 is left standing, so that the second transistor 202 becomes normally off (see FIG. 24). As described above, even when voltage of 0 V is applied to the second gate electrode 208, the data can be erased only by ultraviolet irradiation. Although erasure of data in the memory cell 220 is described here, in the case where the memory includes a plurality of memory cells 220, all data in the memory cells 220 can be erased at once by irradiating all the second transistors 202 with ultraviolet light.

Ultraviolet light is the same as that shown in Embodiments 1 and 2.

The first transistor 201 and the third transistor 203 are formed using a similar structure and material to the first transistor 20 of Embodiment 1. The second transistor 202 is formed using a similar structure and material to the second transistor 21 of Embodiment 1.

The memory cell 220 of this embodiment can be fabricated in the manner shown in Embodiment 1.

Embodiment 4

This embodiment shows a nonvolatile memory including a memory cell including a transistor and a capacitor. The transistor includes a channel, a gate electrode, a source electrode, and a drain electrode. The channel is formed in an oxide semiconductor. One of the source electrode and the drain electrode is electrically connected to one electrode of the capacitor. Data writing in the memory cell is done by raising a potential of a node between one of the source electrode and the drain electrode and the one electrode of the capacitor, or by storing charge in the node. The data in the memory cell is erased by irradiating the channel with ultraviolet light and lowering the potential of the node, or by releasing the charge from the node.

Figure 25:
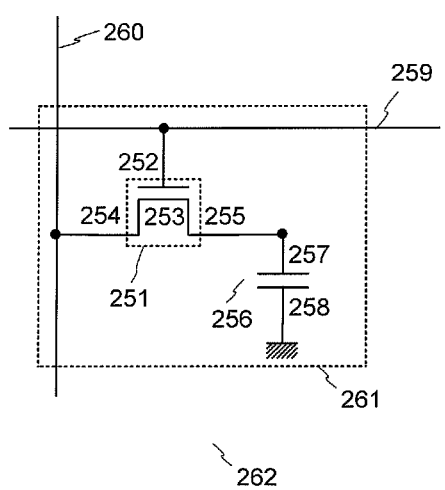
FIG. 25 is a diagram illustrating the circuit of a nonvolatile memory.

A nonvolatile memory 262 includes a memory cell 261 including a transistor 251 and a capacitor 256 (see FIG. 25).

The transistor 251 includes a channel 253, a gate electrode 252, an electrode 255 (one of the source electrode and the drain electrode), and an electrode 254 (the other one of the source electrode and the drain electrode). The capacitor 256 includes one electrode 257, the other electrode 258, and an insulating film between the electrode 257 and the electrode 258.

The gate electrode 252 is electrically connected to a word line 259. The electrode 255 is electrically connected to the electrode 257. The electrode 254 is electrically connected to a bit line 260. The electrode 258 is grounded.

The material for the channel 253 includes an oxide semiconductor. The transistor 251 using an oxide semiconductor is characterized by extremely low off-state current. Hence, when the transistor 251 is off, the potential of the electrode 257 of the capacitor 256 can be held for extremely long periods of time. In other words, even when no potential is applied to the second gate electrode 252 (the power is turned off), charge stored in the capacitor 256 can be held for extremely long periods of time. Thus, a nonvolatile memory is achieved.

Since the potential of the electrode 257 can be held, data writing, data holding, and data reading are achieved. Further, data is easily be erased by ultraviolet irradiation.

(Method of Operation)

The operation of the nonvolatile memory 262 will be described.

1. Data Writing and Data Holding

Figure 26A:
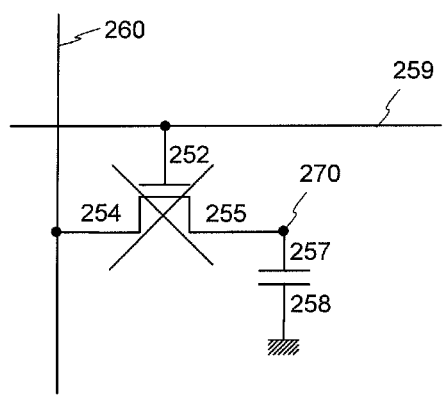
FIGS. 26A and 26B are diagrams illustrating the operation of a nonvolatile memory.

In an initial state, the transistor 251 is off (see FIG. 26A).

Figure 26B:
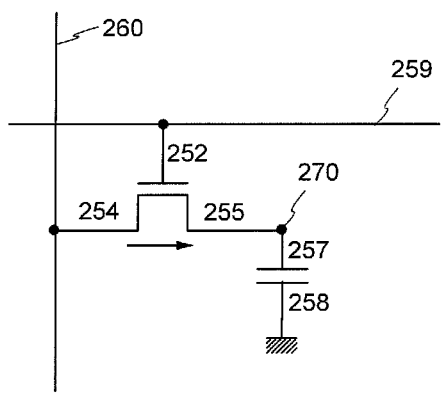

Voltage ($V_G$) is applied to the word line 259 and voltage ($V_G$) is applied to the gate electrode 252. Thus, the transistor 251 is turned on. This holds for $V_G \geq$ the threshold voltage of the transistor 251 ($V_{TH}$) (the voltage $V_G$ is higher than or equal to the voltage $V_{TH}$). When the transistor 251 is turned on, the potential of the bit line 260 ($V_{SD}$) is applied to a node 270 between the electrode 255 and the electrode 257 and to the electrode 257. The potential of the node 270 and the electrode 257 is increased. Charge from the bit line 260 is stored in the node 270 through the electrode 254 and the electrode 255. Charge is also stored in the capacitor 256 (see FIG. 26B, data writing).

Figure 27:
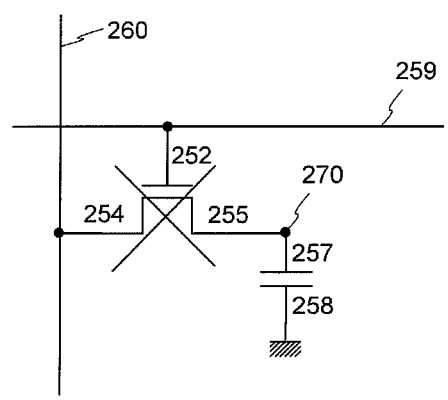
FIG. 27 is a diagram illustrating the operation of a nonvolatile memory.

In a next step, the potential at which the transistor 251 is turned off, e.g. 0 V, is applied to the gate electrode 252. This holds for $0 < V_{TH}$. As stated above the transistor 251 offers extremely low off-state current, so that the potential of the node 270 and the electrode 257 is not decreased but held. Charge stored in the node 270 and the first capacitor 256 is held (see FIG. 27, data holding).

2. Data Reading and Data Erasure

Figure 28A:
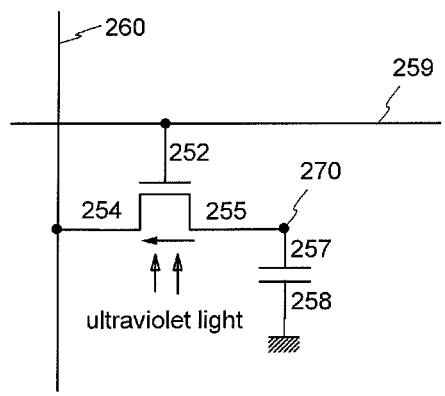
FIGS. 28A and 28B are diagrams illustrating the operation of a nonvolatile memory.

The channel 253 of the transistor 251 is irradiated with ultraviolet light. The transistor 251 becomes normally on, i.e. on, when irradiated with ultraviolet light (see FIG. 28A). The transistor 251 becomes on even when voltage of 0 V is applied to the gate electrode 252. The transistor 251 remains on even when ultraviolet irradiation is stopped.

Figure 28B:
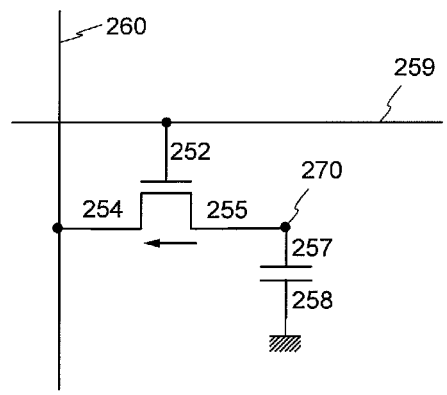
Figure 29:
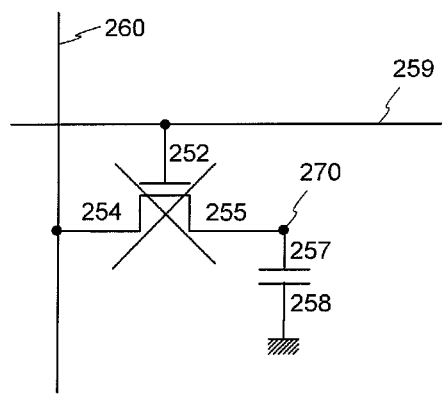
FIG. 29 is a diagram illustrating the operation of a nonvolatile memory.

At that time, the potential of the bit line 260 is decreased to lower than the potential of the node 270. Since the transistor 251 is on, the potential of the node 270 is decreased. Charge stored in the node 270 and the capacitor 256 is released (see FIG. 28B, data reading and data erasure). In a next step, the transistor 251 is left standing, so that the transistor 251 becomes normally off (see FIG. 29). As described above, even when voltage of 0 V is applied to the gate electrode 252, the data can be read and erased only by ultraviolet irradiation.

Ultraviolet light is the same as that shown in Embodiments 1, 2, and 3.

Figure 30:
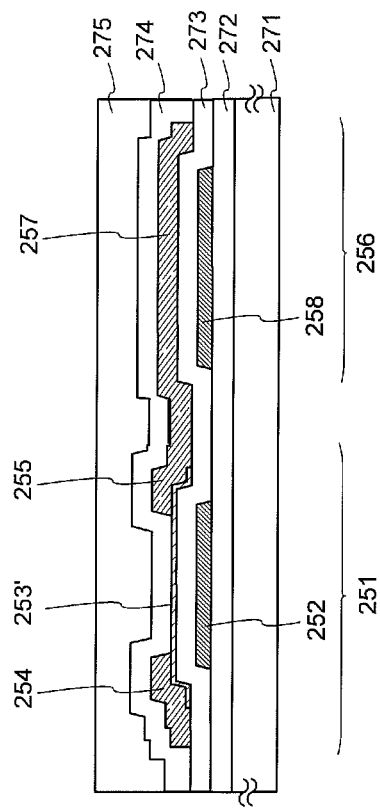
FIG. 30 is the cross-sectional view of a nonvolatile memory.

The structure of the transistor 251 and the capacitor 256 will be described with reference to FIG. 30. The transistor 251 and the capacitor 256 are formed over an insulating layer 272, which is a base film formed over a substrate 271.

The transistor 251 includes a gate electrode 252, a gate insulating layer 273, an oxide semiconductor layer 253' which is to be the channel, an electrode 255, and an electrode 254. The capacitor 256 includes an electrode 258, a gate insulating layer 273, an electrode 257, an insulating layer 274 which is to be a passivation film, and an insulating layer 275 which is to be a planarization film.

The substrate 271 is a glass substrate, a plastic substrate, or the like. The insulating layer 272 which is a silicon oxide film or the like is formed over the substrate 271. The gate electrode 252 and the electrode 258 are formed over the insulating layer 272. The gate insulating layer 273 is formed over the gate electrode 252 and the electrode 258. The oxide semiconductor layer 253' is formed over the gate insulating layer 273. The electrode 255, the electrode 254, and the electrode 257 are formed over the oxide semiconductor layer 253' and the gate insulating layer 273. The electrode 255 and the electrode 257 are formed using the same conductive film here, but they can also be formed using different conductive films. The insulating layer 274 is formed over the oxide semiconductor layer 253', the electrode 255, the electrode 254, and the electrode 257. The insulating layer 275 is formed over the insulating layer 274.

The materials for the gate electrode 252, the electrode 258, the gate insulating layer 273, the oxide semiconductor layer 253', the electrode 255, the electrode 254, the electrode 257, the insulating layer 274, and the insulating layer 275 is the same as that described in Embodiment 1.

The method for fabricating the transistor 251 and the capacitor 256 is the same as that described in Embodiment 1.

Embodiment 5

In this embodiment, examples of the electronic appliance equipped with the nonvolatile memory according to any of Embodiments 1, 2, 3, and 4 is described with reference to FIGS. 31A to 31F. The nonvolatile memory according to any of Embodiments 1, 2, 3, and 4 can hold data even when not supplied with power. Further, in the nonvolatile memory, data is easily erased and high-speed operation is achieved. Therefore, it is possible to provide an electronic appliance with a new structure using the nonvolatile memory. Note that the nonvolatile memory according to any of Embodiments 1, 2, 3, and 4 is mounted on a circuit substrate or the like integrated with other components, and thus built into the electronic appliance.

Figure 31A:
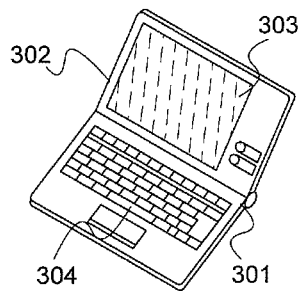
FIGS. 31A to 31F are drawings each illustrating an electronic appliance using a nonvolatile memory.

FIG. 31A shows a laptop PC including the nonvolatile memory according to any of Embodiments 1, 2, 3, and 4. The laptop PC includes a main body 301, a housing 302, a display portion 303, a keyboard 304, and the like.

Figure 31D:
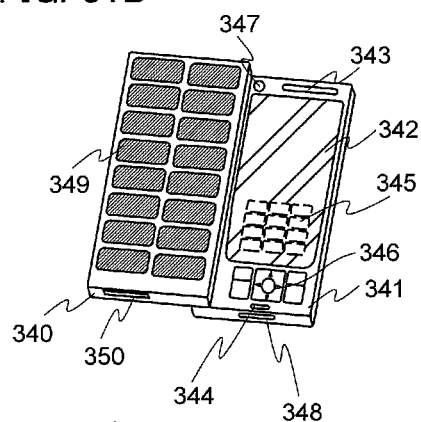
Figure 31B:
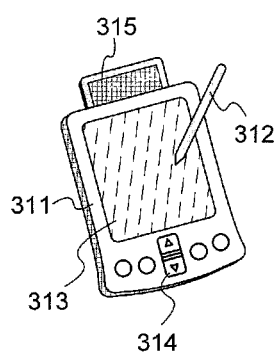

FIG. 31B shows a personal digital assistant (PDA) including the nonvolatile memory according to any of Embodiments 1, 2, 3, and 4. The personal digital assistant includes a main body 311 provided with a display portion 313, an external interface 315, operational keys 314, and the like. In addition, the personal digital assistant includes a stylus 312 which is an accessory for operation.

Figure 31E:
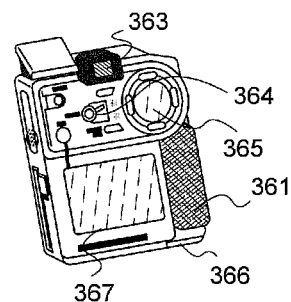
Figure 31C:
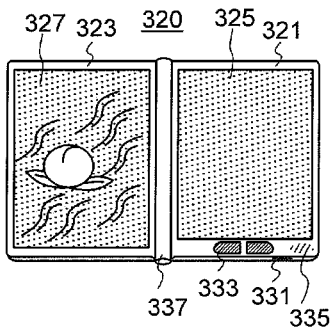

FIG. 31C shows an electronic book 320 as an example of the electronic paper including the nonvolatile memory according to any of Embodiments 1, 2, 3, and 4. The electronic book 320 includes two housings: a housing 321 and a housing 323. The housing 321 is combined with the housing 323 by a hinge 337, so that the electronic book 320 can be opened and closed using the hinge 337 as an axis. Such a structure allows the same use of the electronic book 320 as that of paper books.

The housing 321 includes a display portion 325, and the housing 323 includes a display portion 327. The display portion 325 and the display portion 327 can display a continuous image or different images. The structure for displaying different images enables text to be displayed on the right display portion (the display portion 325 in FIG. 31C) and images to be displayed on the left display portion (which is the display portion 327 in FIG. 31C).

FIG. 31C shows an example of the case where the housing 321 includes an operating portion. For example, the housing 321 includes a power button 331, control keys 333, a speaker 335, and the like. The control keys 333 allow pages to be turned. Note that a keyboard, a pointing device, or the like can also be provided on the same face as the display portion. Furthermore, an external connection terminal (an earphone terminal, a USB terminal, a terminal connectable to various cables such as an AC adapter and a USB cable, or the like), a recording medium insertion portion, and the like can be provided on the back surface or a side surface of the housing. The electronic book 320 can also serve as an electronic dictionary.

In addition, the electronic book 320 can send and receive information wirelessly. Through wireless communication, desired book data or the like can be purchased and downloaded from an electronic book server.

Note that electronic paper can be used for electronic appliances in all fields as long as they display data. For example, to display data, electronic paper can be applied to posters, advertisement in vehicles such as trains, a variety of cards such as credit cards, and so on in addition to electronic books.

FIG. 31D shows a mobile phone including the nonvolatile memory according to any of Embodiments 1, 2, 3, and 4. The mobile phone includes two housings: a housing 340 and a housing 341. The housing 341 includes a display panel 342, a speaker 343, a microphone 344, a pointing device 346, a camera lens 347, an external connection terminal 348, and the like. The housing 340 includes a solar cell 349 charging the mobile phone, an external memory slot 350, and the like. An antenna is built in the housing 341.

The display panel 342 has a touch panel system. A plurality of control keys 345 which is displayed as an image is shown by dashed lines in FIG. 31D. Note that the mobile phone includes a booster circuit for increasing a voltage output from the solar cell 349 to a voltage needed for each circuit. It is possible for the mobile phone to have, in addition to the above structure, a structure in which a noncontact IC chip, a small recording device, or the like are formed.

The display orientation of the display panel 342 changes as appropriate in accordance with the application mode. Further, the camera lens 347 is provided on the same face as the display panel 342, so that the mobile phone can be used as a video phone. The speaker 343 and the microphone 344 can be used for videophone calls, recording, and playing sound, etc. as well as voice calls. Moreover, the housings 340 and 341 which are shown unfolded in FIG. 31D can overlap with each other by sliding. Thus, the mobile phone can be in a suitable size for portable use.

The external connection terminal 348 is connectable to an AC adaptor and a variety of cables such as a USB cable, which enables charging of the mobile phone or data communication. Moreover, a larger amount of data can be saved and moved by inserting a recording medium to the external memory slot 350. The mobile phone can be capable of, in addition to the above, infrared communication, television reception, or the like.

FIG. 31E shows a digital camera including the nonvolatile memory according to any of Embodiments 1, 2, 3, and 4. The digital camera includes a main body 361, a display portion A 367, an eyepiece 363, an operation switch 364, a display portion B 365, a battery 366, and the like.

Figure 31F:
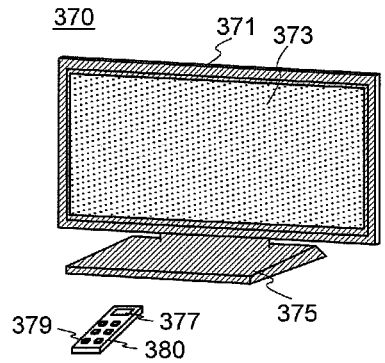

FIG. 31F shows a television set including the nonvolatile memory according to any of Embodiments 1, 2, 3, and 4. A television set 370 has a housing 371 including a display portion 373. Images can be displayed on the display portion 373. Here, the housing 371 is supported by a stand 375.

The television set 370 can be operated by an operation switch included in the housing 371 or by a remote controller 380. Channels and volume can be controlled by a control key 379 included in the remote controller 380, and images displayed on the display portion 373 can thus be controlled. Note that the remote controller 380 can be provided with a display portion 377 displaying data from the remote controller 380.

Note that the television set 370 preferably includes a receiver, a modem, and the like. The receiver allows the television set 370 to receive a general television broadcast. In addition, the television set 370 is capable of one-way (from a transmitter to a receiver) or two-way (between a transmitter and a receiver, between receivers, or the like) data communication when connected to a communication network by wired or wireless connection via the modem.

The methods and structures described in this embodiment can be combined as appropriate with any of those described in the other embodiments.

This application is based on Japanese Patent Application serial no. 2009-266407 filed with Japan Patent Office on Nov. 24, 2009, the entire contents of which are hereby incorporated by reference.

The invention claimed is:

1. A semiconductor device comprising a memory cell, the memory cell including a first transistor and a second transistor,
- wherein the first transistor comprises a first semiconductor layer, a first gate electrode, a first source electrode, and a first drain electrode,
- wherein the second transistor comprises a second semiconductor layer, a second gate electrode, a second source electrode, and a second drain electrode,
- wherein the second semiconductor layer includes an oxide semiconductor material,
- wherein one of the second source electrode and the second drain electrode is electrically connected to the first gate electrode, and
- wherein charge accumulated in the first gate electrode is discharged by irradiating the second semiconductor layer with an ultraviolet light.

2. The semiconductor device according to claim 1, wherein a threshold voltage of the second transistor is configured to be changed by irradiating the second semiconductor layer with the ultraviolet light.

3. The semiconductor device according to claim 1, wherein the second transistor is made a normally-on transistor by irradiating the second semiconductor layer with the ultraviolet light.

4. The semiconductor device according to claim 1, wherein the second semiconductor layer is located above the first semiconductor layer.

5. The semiconductor device according to claim 1, wherein the second source electrode is in contact with a bottom surface of the second semiconductor layer.

6. A semiconductor device comprising a first memory cell and a second memory cell,
- wherein the first memory cell comprises a first transistor, a second transistor, and a first capacitor,
- wherein the first transistor comprises a first semiconductor layer, a first gate electrode, a first source electrode, and a first drain electrode,
- wherein the second transistor comprises a second semiconductor layer, a second gate electrode, a second source electrode, and a second drain electrode,
- wherein the second semiconductor layer includes a first oxide semiconductor material,
- wherein one of the second source electrode and the second drain electrode is electrically connected to the first gate electrode and a first electrode of the first capacitor,
- wherein the second memory cell comprises a third transistor, a fourth transistor, and a second capacitor,
- wherein the third transistor comprises a third semiconductor layer, a third gate electrode, a third source electrode, and a third drain electrode,
- wherein the fourth transistor comprises a fourth semiconductor layer, a fourth gate electrode, a fourth source electrode, and a fourth drain electrode,
- wherein the fourth semiconductor layer includes a second oxide semiconductor material,
- wherein one of the fourth source electrode and the fourth drain electrode is electrically connected to the third gate electrode and a first electrode of the second capacitor,
- wherein one of the first source electrode and the first drain electrode is electrically connected to one of the third source electrode and the third drain electrode,
- wherein charge accumulated in the first gate electrode is discharged by irradiating the second semiconductor layer with a first ultraviolet light, and
- wherein charge accumulated in the third gate electrode is discharged by irradiating the fourth semiconductor layer with a second ultraviolet light.

7. The semiconductor device according to claim 6, wherein a threshold voltage of the second transistor is configured to be changed by irradiating the second semiconductor layer with the first ultraviolet light.

8. The semiconductor device according to claim 6, wherein the second transistor is made a normally-on transistor by irradiating the second semiconductor layer with the first ultraviolet light.

9. The semiconductor device according to claim 6, wherein the second semiconductor layer is located over the first semiconductor layer.

10. The semiconductor device according to claim 6, wherein the second source electrode is in contact with a bottom surface of the second semiconductor layer.

11. The semiconductor device according to claim 6, wherein a conductive layer includes the one of the first source electrode and the first drain electrode and the one of the third source electrode and the third drain electrode.

12. The semiconductor device according to claim 6, wherein the first ultraviolet light and the second ultraviolet light are emitted at the same time.

13. The semiconductor device according to claim 6, wherein the first oxide semiconductor material is the second oxide semiconductor material.

* * * * *